United States Patent
Ji et al.

(10) Patent No.: US 12,120,934 B2
(45) Date of Patent: Oct. 15, 2024

(54) ELECTRONIC DEVICE INCLUDING A PROTECTION LAYER

(71) Applicant: SAMSUNG DISPLAY CO., LTD., Yongin-si (KR)

(72) Inventors: Mi-Ran Ji, Hwaseong-si (KR); Hyeonbum Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 344 days.

(21) Appl. No.: 17/353,719

(22) Filed: Jun. 21, 2021

(65) Prior Publication Data

US 2022/0115445 A1  Apr. 14, 2022

(30) Foreign Application Priority Data

Oct. 13, 2020 (KR) ........................ 10-2020-0132178

(51) Int. Cl.
*H10K 59/38* (2023.01)
*H10K 50/86* (2023.01)
*H10K 59/122* (2023.01)
*H10K 59/40* (2023.01)

(52) U.S. Cl.
CPC ........... *H10K 59/38* (2023.02); *H10K 50/865* (2023.02); *H10K 59/122* (2023.02); *H10K 59/40* (2023.02)

(58) Field of Classification Search
CPC .... H10K 59/38; H10K 50/865; H10K 59/122; H10K 59/40; H10K 59/1201; H10K 59/12; H10K 50/841; H10K 77/111; H10K 50/844; Y02E 10/549; G02B 1/14; G02B 6/0026; G06F 1/1656; G06F 1/1684; G06F 3/0412

See application file for complete search history.

(56) References Cited

U.S. PATENT DOCUMENTS

| | | | |
|---|---|---|---|
| 9,116,564 B2 | 8/2015 | Yum | |
| 9,348,474 B2 | 5/2016 | Hong | |
| 9,448,671 B2 | 9/2016 | Kim | |
| 10,777,101 B2* | 9/2020 | Park | ........................ G09F 9/301 |
| 10,847,586 B2 | 11/2020 | Lee | |
| 11,194,436 B2* | 12/2021 | Do | ........................ G06F 3/0448 |

(Continued)

FOREIGN PATENT DOCUMENTS

| | | |
|---|---|---|
| KR | 10-1932164 | 3/2019 |
| KR | 10-2036240 | 10/2019 |

(Continued)

*Primary Examiner* — Benjamin P Sandvik
*Assistant Examiner* — John Patrick Cornely
(74) *Attorney, Agent, or Firm* — F. Chau & Associates, LLC

(57) ABSTRACT

An electronic device includes a base layer that is divided into an active area and a peripheral area adjacent to the active area. A circuit layer is disposed on the base layer. A display element layer is disposed on the circuit layer and corresponds to the active area. A sensor layer is disposed on the display element layer. A filter layer is disposed on the sensor layer and corresponds to the active area. The filter layer includes a light blocking part and a color filter part. A protection layer is disposed on the circuit layer and corresponds to the peripheral area. The protection layer includes a color protection part or a light blocking protection part.

20 Claims, 15 Drawing Sheets

(56) References Cited

U.S. PATENT DOCUMENTS

| | | | |
|---|---|---|---|
| 2016/0093685 A1* | 3/2016 | Kwon | H10K 77/111 |
| | | | 257/40 |
| 2019/0129240 A1* | 5/2019 | Chen | G02F 1/133514 |
| 2019/0394869 A1 | 12/2019 | Kim et al. | |
| 2020/0004296 A1 | 1/2020 | Paek et al. | |
| 2020/0022267 A1 | 1/2020 | Han et al. | |
| 2020/0091247 A1 | 3/2020 | Lee et al. | |
| 2021/0328107 A1 | 10/2021 | An et al. | |
| 2021/0358342 A1* | 11/2021 | Liu | H10K 59/121 |

FOREIGN PATENT DOCUMENTS

| | | |
|---|---|---|
| KR | 10-2019-0128025 | 11/2019 |
| KR | 10-2020-0000510 | 1/2020 |
| KR | 10-2020-0002576 | 1/2020 |
| KR | 10-2020-0006646 | 1/2020 |
| KR | 10-2020-0031748 | 3/2020 |
| KR | 10-2020-0039859 A | 4/2020 |
| KR | 10-2117103 | 6/2020 |
| KR | 10-2021-01306 | 11/2021 |

* cited by examiner

ELECTRONIC DEVICE INCLUDING A PROTECTION LAYER

CROSS-REFERENCE TO RELATED APPLICATIONS

This U.S. non-provisional patent application claims priority under 35 U.S.C. § 119 to Korean Patent Application No. 10-2020-0132178, filed on Oct. 13, 2020, the entire contents of which are hereby incorporated by reference.

TECHNICAL FIELD

The present disclosure relates to an electronic device and, more particularly, to an electronic device including a protection layer.

DISCUSSION OF THE RELATED ART

Various types of display devices are being used to provide image information. Such display devices includes a display module that is divided into a display area and a non-display area. A plurality of pixel areas are defined within the display area. A pad part connected to a circuit layer or driving circuit hoard for controlling the pixel areas is disposed on the non-display area.

In the electronic device, the non-display area might be hidden from the view of the user. However, when the non-display area is exposed, functional layers may be provided to protect the exposed non-display area and its sensitive elements such as the driving circuit board that may be disposed therein. These functional layers that serve to protect the exposed non-display areas may require additional manufacturing steps.

SUMMARY

An electronic device includes a base layer that is divided into an active area and a peripheral area adjacent to the active area. A circuit layer is disposed on the base layer. A display element layer is disposed on the circuit layer to correspond to the active area. A sensor layer is disposed on the display element layer. A filter layer is disposed on the sensor layer to correspond to the active area. The filter layer includes a light blocking part and a color filter part disposed on the light blocking part. The color filter part includes a green filter part, a blue filter part, and a red filter part. A protection layer is disposed on the circuit layer to correspond to the peripheral area. The protection layer includes a color protection part, that includes a green protection part, a blue protection part, and a red protection part, or a light blocking protection part that includes a black pigment or dye.

The peripheral area may include a first peripheral portion that is adjacent to the active area, does not overlap the display element layer, and overlaps the sensor layer. A second peripheral portion may be spaced apart from the active area and might not overlap the display element layer and the sensor layer. The protection layer may overlap the first peripheral portion and at least a portion of the second peripheral portion.

The second peripheral portion may include a bent portion bent with respect to a bending axis extending in one direction. A first sub peripheral portion may be disposed between the first peripheral portion and the bent portion. A second sub peripheral portion may be spaced apart from the first peripheral portion and adjacent to an edge of the base layer.

The protection layer may entirely overlap the first peripheral portion and the second peripheral portion.

The protection layer may overlap the first peripheral portion and the bent portion and might not overlap the first sub peripheral portion and the second sub peripheral portion.

The protection layer may overlap the first peripheral portion and include the green protection part, the blue protection part, and the red protection part, that are sequentially laminated.

The protection layer may include a light blocking protection part overlapping the first peripheral portion.

The protection layer may overlap the second peripheral portion and may include the green protection part, the blue protection part, and the red protection part, that are sequentially laminated.

The protection layer may overlap the bent portion and might not overlap the first sub peripheral portion and the second sub peripheral portion, and the protection layer may include the green protection part, the blue protection part, and the red protection part, that are sequentially laminated.

The protection layer may overlap the bent portion and might not overlap the first sub peripheral portion and the second sub peripheral portion, and the protection layer may include: a plurality of sub green protection parts spaced apart from each other on a plane; a plurality of sub blue protection parts spaced apart from each other on the plane; and a plurality of sub red protection parts spaced apart from each other on the plane. The sub green protection parts, the sub blue protection parts, and the sub red protection parts may at least partially overlap sub protection parts having colors different from each other.

The electronic device may further include a support layer disposed below the base layer. The support layer might not overlap the bent portion.

The green filter part and the green protection part may be made of a same material. The blue filter part and the blue protection part may be made of a same material. The red filter part and the red protection part may be made of a same material.

The light blocking part and the light blocking protection part may be made of a same material.

The sensor layer may include: a first conductive layer disposed on the display element layer; a second conductive layer disposed on the first conductive layer; and an inorganic insulating layer disposed between the first conductive layer and the second conductive layer. The light blocking part may cover the second conductive layer.

The green filter part, the blue filter part, and the red filter part may be disposed adjacent to each other on a plane, and the light blocking part may overlap a boundary between the filter parts.

The electronic device may further include a window disposed on the sensor layer and divided into a transmission part and a bezel part. The protection layer may correspond to the bezel part.

An electronic device, that is divided into an active area including a plurality of emission areas and a peripheral area disposed outside the active area, includes: a circuit layer; a display element layer disposed on the circuit layer and including a light emitting element and a pixel defining layer configured to divide the emission areas; a sensor layer disposed on the display element layer; a filter layer disposed on the sensor layer to correspond to the active area, the filter layer including a light blocking part and a plurality of color filter parts disposed on the light blocking part; and a protection layer disposed on the circuit layer to correspond to the peripheral area. The protection layer includes a light blocking protection part or a color protection part. The color protection part includes a green protection part, a blue protection part, and a red protection part.

The peripheral area may include: a first peripheral portion that is adjacent to the active area, does not overlap the display element layer, and overlaps the sensor layer; and a second peripheral portion that is spaced apart from the active area and does not overlap the display element layer and the sensor layer. The protection layer may overlap the first peripheral portion and at least a portion of the second peripheral portion.

The protection layer overlapping the first peripheral portion may be disposed directly on the sensor layer.

The protection layer overlapping the first peripheral portion may be disposed on the pixel defining layer.

An electronic device includes a substrate including an active area and a peripheral area at least partially surrounding the active area. A display panel is disposed on the substrate. A filter layer is disposed on the display panel. The filter layer aligns with the active area of the substrate. The filter layer includes a light blocking part and a color filter part disposed on the light blocking part. A protection layer is disposed on the substrate. The protection layer aligns with the peripheral area of the substrate. The protection layer includes a color protection part that includes a same set of materials as the color filter part.

The color filter part may include a green filter part, a blue filter part, and a red filter part. The color protection part may include a green protection part, a blue protection part, and a red protection part. The green filter part and the green protection part each may include a first material. The blue filter part and the blue protection part may each include a second material. The red filter part and the red protection part may each include a third material.

A sensor layer may be disposed in the display panel. A circuit layer may be disposed on the substrate. The protection layer may cover the circuit layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
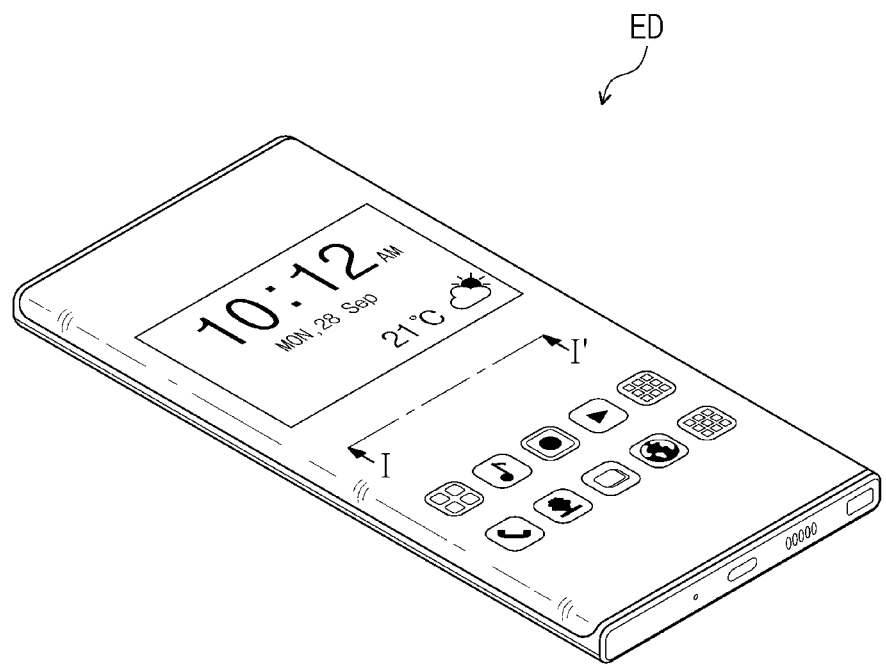
FIG. 1 is a perspective view illustrating an electronic device according to an embodiment.

Since the present disclosure may have diverse modified embodiments, specific embodiments are illustrated in the drawings and are described in the detailed description of the inventive concept. However, the present invention is not necessarily limited to the specific embodiments described and illustrated herein and it should be understood that the present disclosure covers all the modifications, equivalents, and replacements within the idea and technical scope of the present disclosure.

In this specification, it will also be understood that when one component (or area, layer, portion) is referred to as being "on", "connected to", or "coupled to" another component, it can be disposed/connected/coupled directly on/to the one component, or an intervening third component may also be present.

in this specification, "disposed directly" may mean that there is no layer, film, area, plate, or the like between a portion of the layer, the layer, the area, the plate, or the like and the other portion. For example, "disposed directly" may mean being disposed without using an additional member such and an adhesion member between two layers or two members.

Like reference numerals may refer to like elements throughout the specification and the figures. Also, in the figures, the thickness, ratio, and dimensions of components may be exaggerated for clarity of illustration.

The term "and/or" includes any and all combinations of one or more of the associated listed items.

will be understood that although the terms such as 'first' and 'second' are used herein to describe various elements, these elements should not necessarily be limited by these terms. The terms might only be used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings. In this specification, the term "disposed on" may refer to a case in which it is disposed on a lower portion as well as an upper portion of any one member.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, an electronic device according to an embodiment of the inventive concept will be described with reference to the accompanying drawings.

Figure 2:
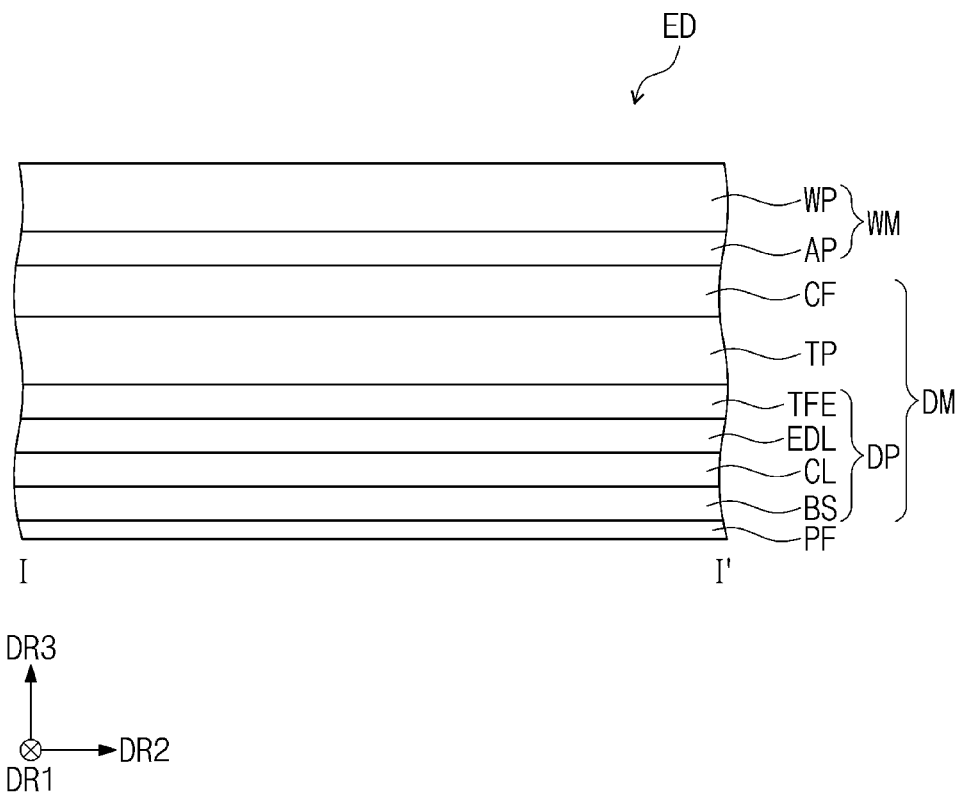
FIG. 2 is a cross-sectional view illustrating an electronic device according to an embodiment.
Figure 3:
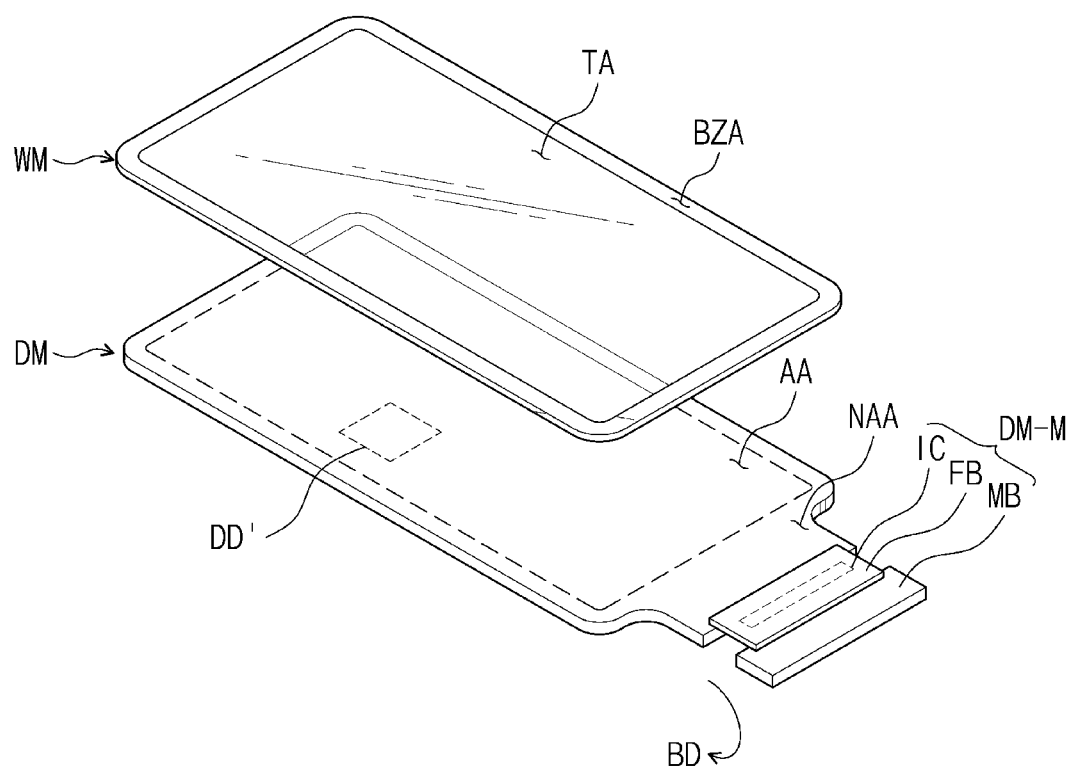
FIG. 3 is an exploded perspective view illustrating an electronic device according to an embodiment.
Figure 4:
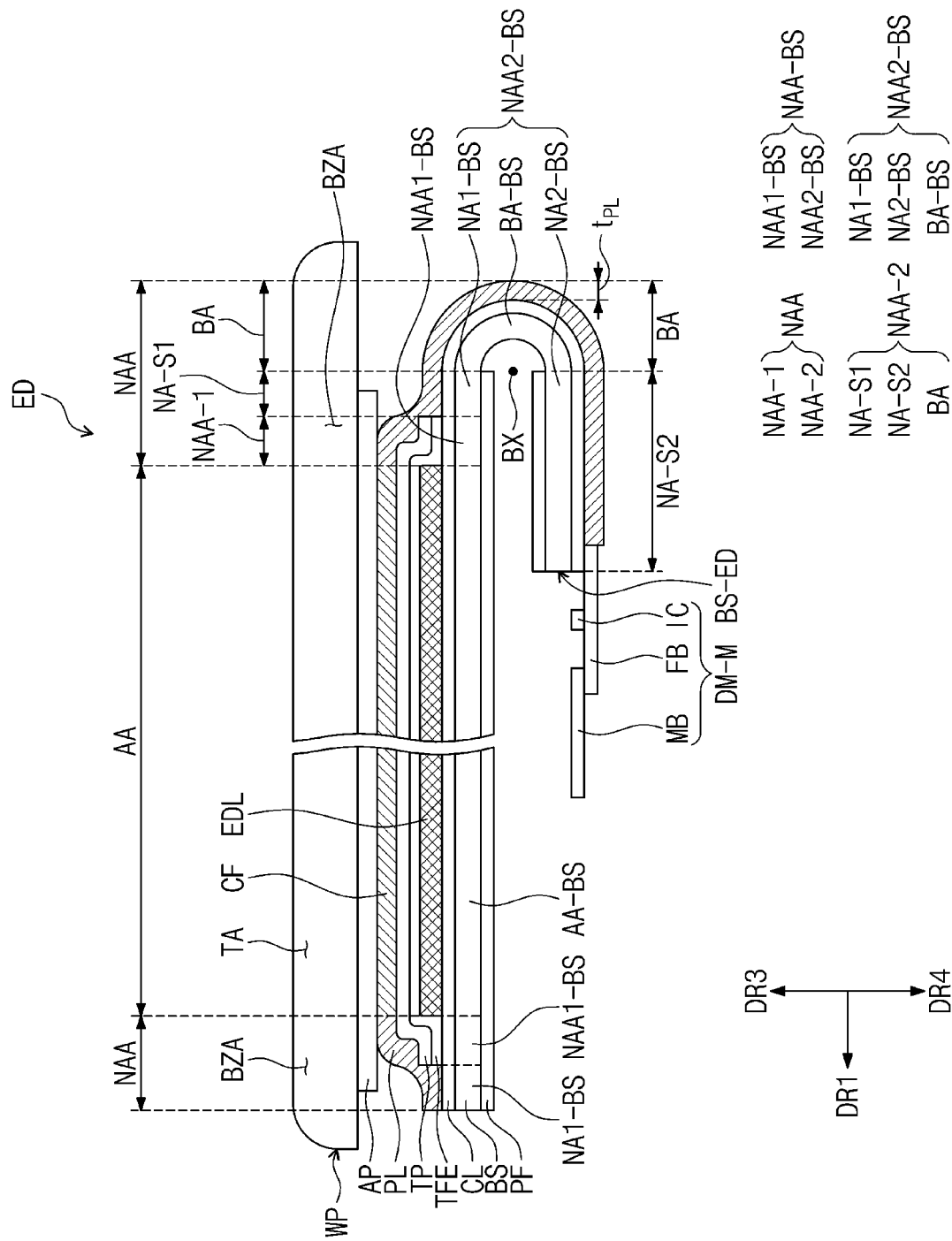
FIG. 4 is a cross-sectional view illustrating an electronic device according to an embodiment.

FIG. 1 is a perspective view illustrating an electronic device according to an embodiment. FIG. 2 is a cross-sectional view illustrating the electronic device according to an embodiment. FIG. 3 is an exploded perspective view illustrating the electronic device according to an embodiment. FIG. 4 is a cross-sectional view illustrating an electronic device according to an embodiment.

An electronic device ED of FIGS. 1 to 4, according to an embodiment, may be a device activated according to an electrical signal. For example, the electronic device ED may be a mobile phone, a tablet computer, a vehicle satellite navigation system, a portable game console, or a wearable device, but embodiments of the inventive concept are not necessarily limited thereto. FIG. 1 illustrates an example in which the electronic device ED is provided as the mobile phone.

The electronic device ED, according to an embodiment, may display an image through an active area AA (see, FIG. 3). The active area AA may primarily occupy a plane defined by a first directional axis DR1 and a second directional axis DR2. The active area AA may further include a curved surface, such as one or more curved edge, that is bent from at least one side of the plane defined by the first and second directional axes DR1 and DR2. The electronic device ED of FIG. 1, according to an embodiment, is illustrated as including two curved surfaces that are bent from both sides of the plane defined by the first directional axis DR1 and the second directional axis DR2. However, the shape of the active area AA is not necessarily limited thereto. For example, the active area AA may be confined to the plane. Alternatively, the active area AA may further include at least two or more curved surfaces, for example, four curved surfaces that are respectively bent from four side surfaces.

In FIG. 1 and the following figures, the first to fourth directional axes DR1 to DR4 are illustrated, and directions indicated by the first to fourth directional axes DR1, DR2, DR3, and DR4, which are described in this specification, may be relative concepts and thus may be differently defined. Also, directions indicated by the first to fourth directional axes DR1, DR2, DR3, and DR4 may be described as first to fourth directions, and the same reference numerals may be used.

In this specification, the first directional axis DR1 and the second directional axis DR2 may be perpendicular to each other, and the third directional axis DR3 may be a normal direction with respect to the plane defined by the first directional axis DR1 and the second directional axis DR2. The fourth directional axis DR4 may be a direction normal to the plane defined by the first directional axis DR1 and the second directional axis DR2 and in a direction opposite to the direction of the third directional axis DR3.

A thickness direction of the electronic device ED may be a direction parallel to the third directional axis DR3, that is a normal direction to the plane defined by the first directional axis DR1 and the second directional axis DR2. In this specification, a front surface (or top surface) and a rear surface (or bottom surface) of each of several members constituting the electronic device ED may be defined based on the third directional axis DR3.

Referring to FIG. 2, the electronic device ED, according to an embodiment, may include a display module including a display layer DP, a sensor layer TP disposed on the display layer DP, and a filter layer CF disposed on the sensor layer TP.

The display layer DP (e.g., a display panel) may include a base layer BS (e.g., a substrate), a circuit layer CL disposed on the base layer BS, a display element layer EDL disposed on the circuit layer CL, and an encapsulation layer TFE (e.g., a thin film encapsulation layer) disposed on the display element layer EDL. The encapsulation layer TFE may at least partially cover the display element layer EDL. The display module DM may further include a support layer PF disposed below the base layer BS. The support layer PF may be an external casing made of, for example, metal, plastic or glass.

The electronic device ED, according to an embodiment, may further include a window member WM disposed on the display module DM. The window member WM may include a window WP and an adhesive layer AP, and the adhesive layer AP may be disposed between the filter layer CF and the window WP. The adhesive layer AP may be an optically clear adhesive film (OCA) or an optically clear adhesive resin layer (OCR). In an embodiment, the adhesive layer AP may be omitted and the window WP may be disposed directly on the filter layer CF.

The window WP may cover the entire outside of the display module DM. The window WP may have a shape corresponding to a shape of the display module DM. As used herein, the phrase, "corresponding to" is intended to mean that there is a similar shape between the two elements and that their boundaries are substantially aligned in a cross-sectional view. Thus, here the window WP may have a similar shape to the display module DM and the boundaries of these two elements may substantially align. In the electronic device ED, according to an embodiment, the window WP may include an optically transparent insulating material. The window WP may be a glass substrate or a polymer substrate. For example, the window WP may be a tempered glass substrate that is reinforced, for example, with a chemical strengthening agent.

Referring to FIGS. 3 and 4, the electronic device may further include a driving part DM-M electrically connected to the display module DM. The driving part DM-M may be electrically connected to the display layer DP and the sensor layer TP.

The driving part DM-M may include a driving chip IC mounted thereon. The driving chip IC may generate or process various electrical signals, and the driving, chip IC may be electrically connected to the display layer DP and the sensor layer TP to control the display layer DP and the sensor layer TP.

In an embodiment, the driving part DM-M may include a flexible circuit board FB and a driving circuit board MB. The flexible circuit board FB may have one side that is electrically connected to the display layer DP and the sensor layer TP and the other side that is electrically connected to the driving circuit board MB. The driving chip IC may be mounted on the flexible circuit board FB. In this case, the flexible circuit board FB may also be referred to as a chip on film (CoF). The driving chip IC may be disposed on the base layer BS of the display module DM.

In FIG. 3, the driving part DM-M is illustrated to be connected to one side of the display module DM so as to be unfolded, but in the electronic device ED, according to an embodiment, the driving part DM-M may be bent BD in the direction of the fourth directional axis DR4. Referring to FIGS. 3 and 4, the driving part DM-M may be bent and may overlap the display nodule DM.

Referring to FIGS. 3 and 4, the display module DM, according to an embodiment, may be divided into an active area AA and a peripheral area NAA. Accordingly, the electronic device ED including the display module DM, according to an embodiment, may be divided into the active area AA and the peripheral area NAA to correspond to the display module DM.

The active area AA may be an area that is activated according to an electrical signal. The peripheral area NAA may be an area disposed adjacent to at least one side of the active area AA. The peripheral area NAA may at least partially surround the active area AA. However, the embodiment of the inventive concept is not necessarily limited thereto, and unlike the example illustrated in FIG. 3, a portion of the peripheral area NAA, according to an embodiment, may be omitted. A driving circuit or a driving line for driving the active area AA may be disposed in the peripheral area NAA.

In the electronic device ED, according to an embodiment, the window WP may be divided into a transmission part TA and a bezel part BZA. The transmission part TA may be a portion corresponding to the active area AA, and the bezel part BZA may be a portion corresponding to the peripheral area NAA. Again, as used herein, the phrase, "corresponding to" is intended to mean that there is a similar shape between the two elements and that their boundaries are substantially aligned in a cross-sectional view. Thus, here the transmission part TA may substantially overlap and align with the active area AA while the bezel part BZA may substantially overlap and align with the peripheral area NAA such that these elements have substantially aligned boundaries in a cross-sectional view.

A from surface of the window WP including the transmission part TA and the bezel part BZA corresponds to the from surface of the electronic device ED. The user may visually recognize (e.g., the user may see) an image provided through the transmission part TA corresponding to the front surface of the electronic device ED.

The bezel part BZA may define a shape of the transmission part TA. The bezel part BZA is adjacent to the transmission part TA and may at least partially surround the transmission part TA. For example, the bezel part BZA may be disposed adjacent to only one side (or to only two sides or to only three sides) of the transmission part TA, and a portion of the bezel part BZA may be omitted.

In the electronic device ED, according to an embodiment, a portion of the electronic device ED visually recognized through the bezel part BZA may have relatively low visible light transmittance compared to a portion visually recognized through the transmission part TA. In the electronic device ED, according to an embodiment, the display module DM may include a protection layer PL (see, FIG. 4) disposed corresponding to the bezel part BZA to reduce light transmittance of a portion corresponding to the bezel part BZA or allow the portion corresponding to the portion BZA to be visually recognized as having a predetermined color.

The peripheral area NAA of the electronic device ED, according to an embodiment, includes a first peripheral portion NAA-1 adjacent to the active area AA and a second peripheral portion NAA-2 adjacent to the first peripheral portion NAA-1. The second peripheral portion NAA-2 may be a portion spaced apart from the active area AA. Also, the second peripheral portion NAA-2 may include a bent portion BA that is bent with respect to a bending axis BX extending in one direction and sub peripheral portions NA-S1 and NA-S2 adjacent to the bent portion BA. The first sub peripheral portions NA-S1 may be disposed between the first peripheral portion NAA-1 and the bent portion BA. The second sub peripheral portion NA-S2 may be a portion spaced apart from the first peripheral portion NAA-1 and disposed adjacent to an edge BS-ED of the base layer. In an embodiment, the bent portion BA bent with respect to the bending axis BX may have a curvature radius of about 0.2 mm to about 0.3 mm. For example, an inner curvature radius of the bent portion BA that is bent with respect to the bending axis BX may range of about 0.2 mm to about 0.3 mm.

In an embodiment, the first peripheral portion NAA-1 may be a portion at which the base layer BS does not overlap the display element layer EDL and overlaps the sensor layer TP. Also, the second peripheral portion NAA-2 may be a portion at which the base layer BS does not overlap both the display element layer EDL and the sensor layer TP. For example, in an embodiment, the active area AA may be a portion including the base layer BS, the circuit layer CL, the display element layer EDL, and the sensor layer TP that are sequentially laminated, the first peripheral portion NAA-1 may be a portion that includes the base layer BS, the circuit layer CL, and the sensor layer TP, that are sequentially laminated, and does not include the display element layer EDL, and the second peripheral portion NAA-2 may be a portion that includes the base layer BS and the circuit layer CL, that are laminated, and does not include the display element layer EDL and the sensor layer TP.

In the electronic device ED, according to an embodiment, the base layer BS may be a member that provides a base surface on which the display element layer EDL is disposed. The base layer BS may include a glass substrate, a metal substrate, a polymer substrate, and the like. However, the embodiment of the inventive concept is not necessarily limited thereto. For example, the base layer BS may be an inorganic layer, an organic layer, or a composite layer.

The base layer BS may have a multi-layered structure. For example, the base layer BS may have a three-layered structure constituted by a synthetic resin layer, an adhesive layer, and a synthetic resin layer. For example, the synthetic resin layer may include a polyimide-based resin. Also, the synthetic resin layer may include an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and/or a perylene-based resin.

The base layer BS may be divided into an active area AA-BS and a peripheral area NAA-BS. The active area AA-BS of the base layer BS is a portion corresponding to the active area AA of the electronic device ED, and the peripheral area NAA-BS of the base layer BS is a portion corresponding to the peripheral, area NAA-BS of the electronic device ED. The peripheral area NAA-BS of the base layer BS may be an area disposed at at least one side of the active area AA-BS. The peripheral area NAA-BS may be a portion disposed outside the active area AA-BS. The peripheral area NAA-BS ma be a portion surrounding the active area AA-BS.

The peripheral area NAA-BS of the base layer BS may include a first peripheral portion NAA1-BS and a second peripheral portion NAA2-BS. The second peripheral portion NAA2-BS of the base layer BS may include a first sub peripheral portion NA1-BS, a bent portion BA-BS, and a second sub peripheral portion NA2-BS. The first sub peripheral portion NA1-BS may be a portion disposed between the first peripheral portion NAA1-BS and the bent portion BA-BS, and the second sub peripheral portion NA2-BS may be a portion that is spaced apart from the first sub peripheral portion NA1-BS and adjacent to the edge BS-ED of the base layer BS.

The circuit layer CL is disposed on the base layer BS. The circuit layer CL may include an insulating layer, a semiconductor pattern, a conductive pattern, and a signal line. The insulating layer, the semiconductor layer, and the conductive layer may be disposed on the base layer BS in a manner such as by coating or deposition, and then, the insulating layer, the semiconductor layer, and the conductive layer may be selectively patterned through one or more photolithographic processes. Thereafter, the semiconductor pattern, the conductive pattern, and the signal line included in the circuit layer CL may be provided. Constituents of the circuit layer CL corresponding to the active area AA and constituents of the circuit layer CL corresponding to the peripheral area NAA may be different from each other. For example, the constituents of the circuit layer CL corresponding to the peripheral area NAA might not include all of the constituents of the circuit layer CL corresponding to the active area AA. In the circuit layer CL corresponding to the peripheral area NAA, some of the constituents of the circuit layer CL corresponding to the active area AA may be omitted.

The display element layer EDL may be disposed on the circuit layer CL. The display element layer EDL may include a light emitting element. For example, the display element layer EDL may include an organic light emitting element, a quantum dot light emitting element, a micro LED light emitting, element, or a nano LED light emitting element. The display element layer EDL may correspond to the active area AA-BS of the base layer BS.

The encapsulation layer TFE may be disposed on the display element layer EDL. The encapsulation layer TFE may include at least one inorganic layer and at least one organic layer. For example, the encapsulation layer TFE may include an inorganic layer, an organic layer, and an inorganic layer, that are sequentially laminated, but layers constituting the encapsulation layer TTE are not necessarily limited thereto.

The sensor layer TP may be disposed on the display element layer EDL. The sensor layer TP may sense an external input applied from the outside. The external input may be a user's input. The user's input may include various types of external inputs such as a touch by a portion of the user's body, light, heat, a touch of a stylus, a pressure, proximity, or the like.

The sensor layer TP may be disposed on the display layer DP through a continuous process. In this case, the sensor layer TP may be described as being disposed directly on the display layer DP. The direct disposition may mean that a third component is not disposed between the sensor layer TP and the display layer DP. For example, a separate adhesive member might not be disposed between the sensor layer TP and the display layer DP. For example, the sensor layer TP may be disposed directly on the encapsulation layer TFE.

However, the embodiment of the inventive concept is not necessarily limited thereto, and an adhesive member may be further disposed between the sensor layer TP and the display layer DP.

The electronic device ED, according to an embodiment, may include a filter layer CF and a protection layer PL. The filter layer CF may correspond to the active area AA of the electronic device ED, and the protection layer PL may correspond to the peripheral area NAA of the electronic device ED. The filter layer CF may be a portion disposed on the active area AA-BS of the base layer, and the protection layer PL may be a portion disposed on the peripheral area NAA-BS of the base layer.

The filter layer CF may be disposed on the sensor layer TP to correspond to the active area AA-BS of the base layer BS. The filter layer CF may include a light blocking part BM and color filter parts CF-G, CF-B, and CF-R (see FIG. 7).

The protection layer PL may be disposed on the circuit layer CL to correspond to the peripheral area NAA-BS of the base layer BS. The protection layer PL may be disposed on the sensor layer TP in the first peripheral portion NAA-1 and might not overlap the display element layer EDL. The protection layer PL may be disposed on the circuit layer CL in the second peripheral portion NAA-2. The display element layer EDL and the sensor layer TP might not be provided between the protection layer PL and the circuit layer CL in the second peripheral portion NAA-2.

A mean thickness tPL of the protection layer PL disposed on the bent portion BA-BS of the base layer BS may range of about 10 µm or about 50 µm. If the mean thickness tPL of the protection layer PL is less than about 10 µm, the constituents of the display layer DP such as the circuit layer CL might not be sufficiently protected, and the mean thickness tPL of the protection layer PL exceeds about 50 µm, bending characteristics of the display module DM in the bent portion BA may be deteriorated.

Also, a mean modulus of the protection layer PL disposed on the bent portion BA-BS of the base layer BS may range of about 500 MPa to about 5,000 MPa. Since the protection layer PL has a mean modulus value of about 500 MPa to about 5,000 MPa, the protection layer PL may be easily bent in the bent portion BA, and the lower constituents of the protection layer PL may be protected without the protection layer PL is cracked.

In an embodiment, the protection layer PL may be adjacent to the filter layer CF disposed corresponding to the active area AA and may correspond to the peripheral area NAA. For example, the protection layer PL may extend from an outer periphery of the filter layer CF and may correspond to the peripheral area NAA. Also, unlike this, in an embodiment, the protection layer PL might not be connected to the edge of the filter layer CF, and the protection layer PL may be spaced apart from the filter layer CF and may correspond to the peripheral area NAA.

In an embodiment illustrated in FIG. 4, the protection layer PL may correspond to the entire peripheral area NAA. However, the embodiment of the inventive concept is not necessarily limited thereto, and the protection layer PL may correspond to at least a portion of the first and second peripheral portions NAA-1 and NAA-2. For example, the protection layer PL may overlap the entire first peripheral portion NAA-1 and overlap only at least portions of the second peripheral portion NAA-2. The protection layer PL disposed on the second peripheral portion NAA-2 may overlap the bent portion BA-BS of the base layer BS. Also, the protection layer PL disposed on the second peripheral portion NAA-2 may overlap the bent portion BA-BS of the base layer BS and some of the first and second sub peripheral portions NA1-BS and NA2-BS, that are disposed around the bent portion BA-BS. The protection layer PL might not be disposed on the first sub peripheral portion NA1-BS, but may be disposed only on the first peripheral portion NAA-1, the bent portion BA-BS, and the second sub peripheral portion NA2-BS. For example, in an embodiment, the protection layer PL may be disposed on at least a portion of the peripheral area NAA.

Referring to FIG. 4, in an embodiment, the display module DM may further include a support layer PF disposed below the base layer BS. The support layer PF may be flexible. The support layer PF may include a polymer film. For example, the support layer PF may include a polyethylene terephthalate (PET) film. The support layer PF might not be disposed below the bent portion BA-BS of the base layer.

Figure 5:
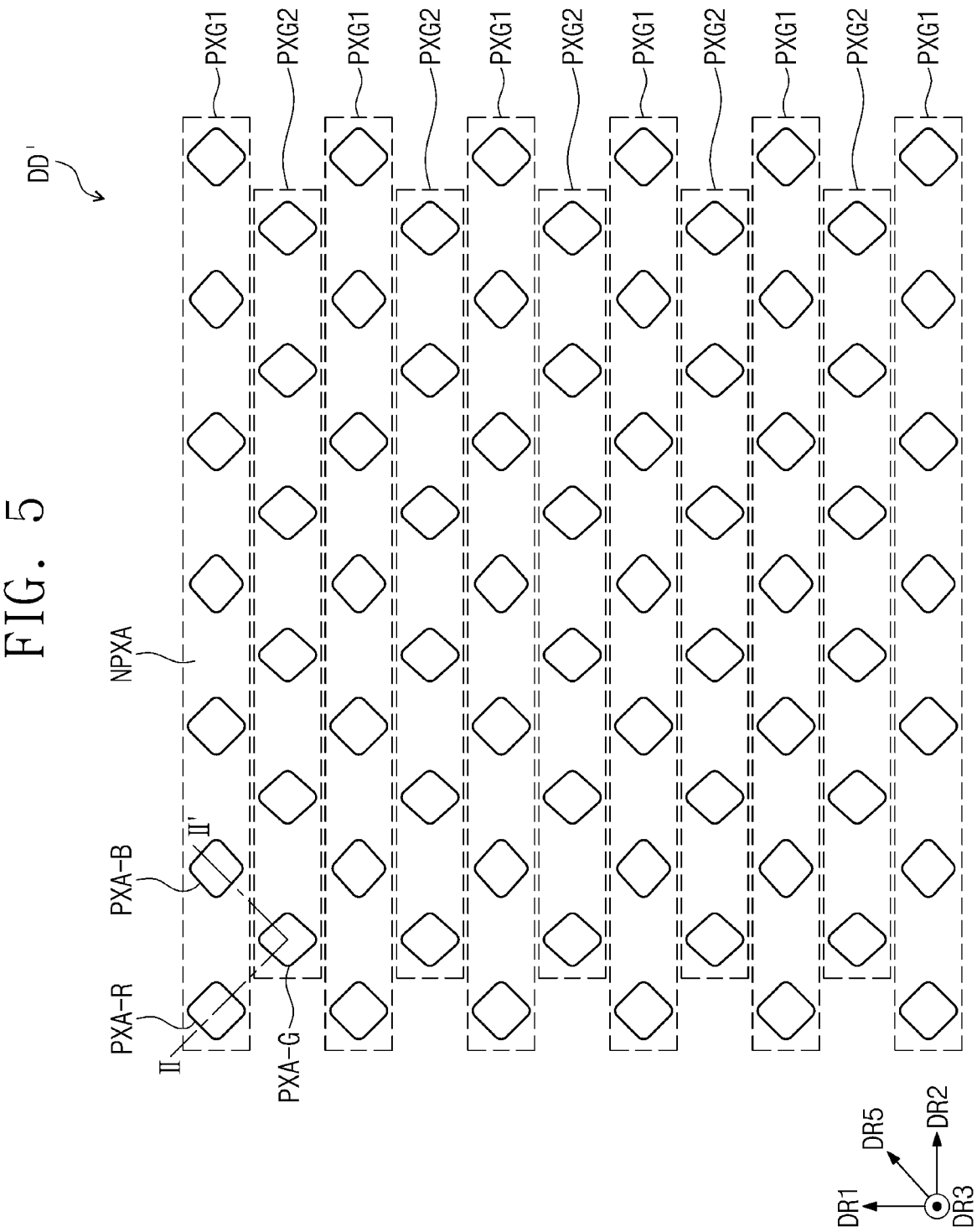
FIG. 5 is a plan view illustrating a portion of the electronic device according to an embodiment.
Figure 6:
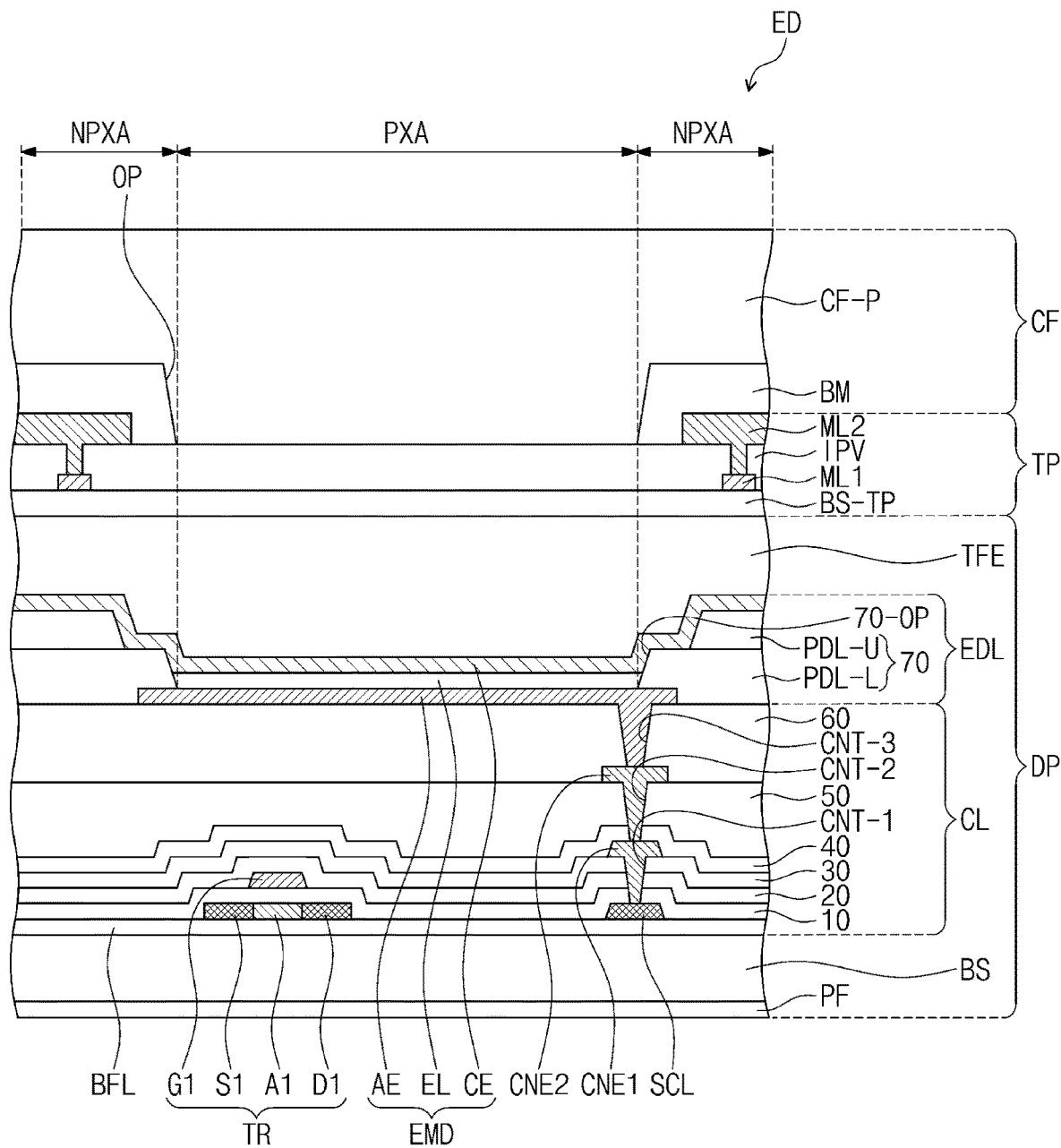
FIG. 6 is a cross-sectional view illustrating a portion of the electronic device according to an embodiment.
Figure 7:
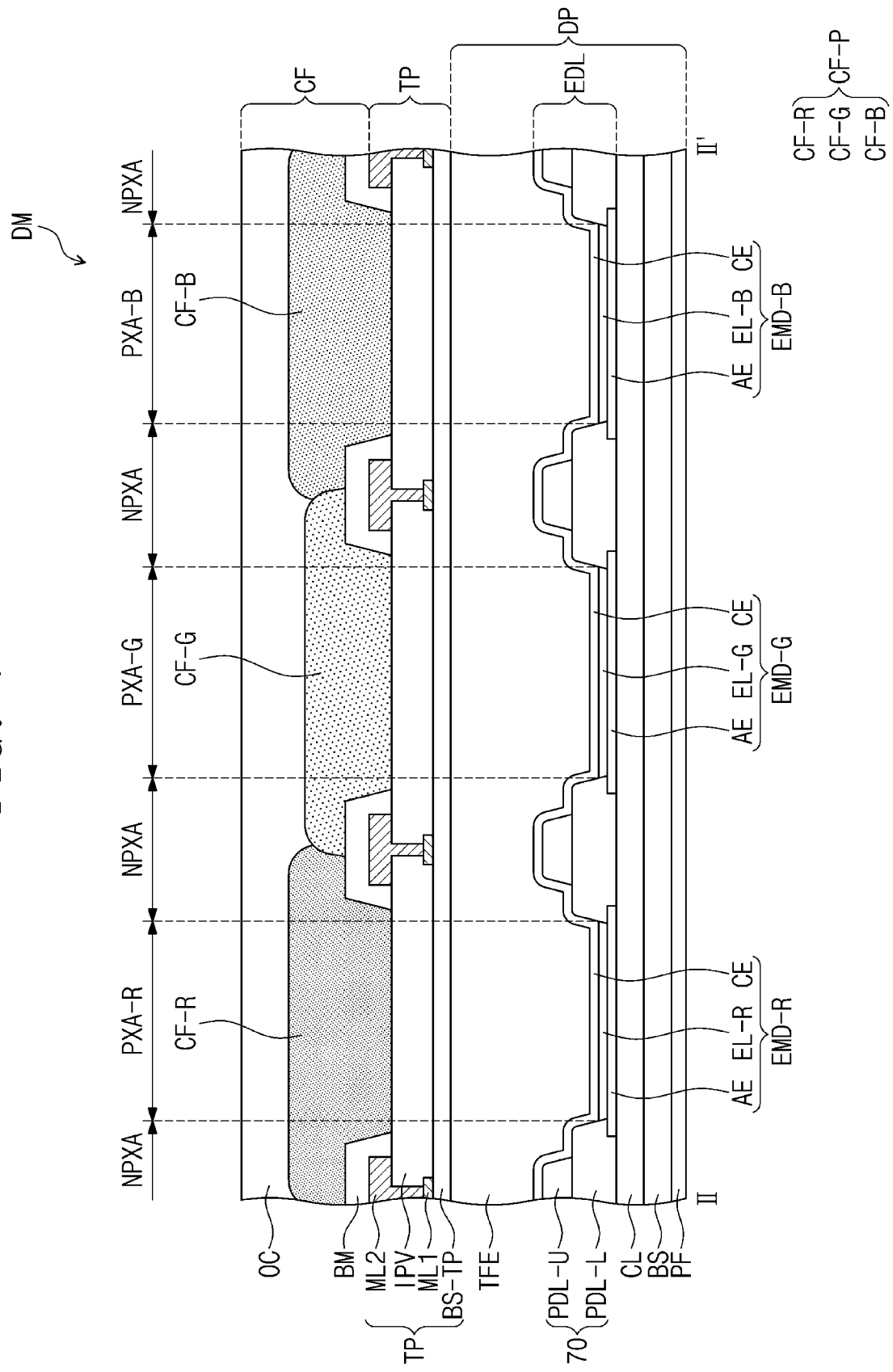
FIG. 7 is a cross-sectional view illustrating an electronic device according to an embodiment.

FIG. 5 is a plan view illustrating a portion of the electronic device according to an embodiment. FIG. 6 is a cross-sectional view illustrating a portion of the electronic device according to an embodiment. FIG. 7 is a cross-sectional view illustrating a portion of the electronic device according to an embodiment. For example, FIG. 7 is a cross-sectional view taken along line II-II' of FIG. 5.

FIG. 5 is a plan view illustrating a portion corresponding to an area DD' that is a partial area of the display module of FIG. 3. Referring to FIGS. 3 and 5, the electronic device ED, according to an embodiment, may include a plurality of emission areas PXA-R, PXA-G, and PXA-B disposed on the active area AA. The electronic device ED may be disposed within the active area AA and include a red emission area PXA-R that emits red light, a green emission area PXA-G that emits green light, and a blue emission area PXA-B that emits blue light. Surface areas of the emission areas emitting light having different wavelengths among the plurality of emission areas PXA-R, PXA-G, and PXA-B may be different from each other. In this case, the surface area may mean an area when viewed on the plane defined by the first and second directional axes DR1 and DR2.

However, the embodiment of the inventive concept is not necessarily limited thereto, and the emission areas PXA-R, PXA-G, and PXA-B have the same surface area, or the emission areas PXA-R, PXA-G, and PXA-B may be provided at a surface area ratio different from that illustrated in FIG. 5. The emission areas PXA-R, PXA-G, and PXA-B may emit light having a color other than red light, green light, and blue light or may have a planar shape different from the illustrated shape.

Referring to FIG. 5, the red emission areas PXA-R and the blue emission areas PXA-B may be alternately arranged along the second directional axis DR2 to form a first group PXG1. The green emission areas PXA-G may be arranged along the second directional axis DR2 to form a second group PXG2.

The first group PXG1 may be spaced apart from the second group PXG2 in the direction of the first directional axis DR1. Each of the first group PXG1 and the second group PXG2 may be provided in plural. The first groups PXG1 and the second groups PXG2 may be alternately arranged along the first directional axis DR1.

One green emission area PXA-G may be spaced apart from one red emission area PXA-R or one blue emission area PXA-B in a direction of the fifth directional axis DR5. The direction of the fifth directional axis DR5 may be a direction between the direction of the first directional axis DR1 and the direction of the second directional axis DR2.

The arrangement structure of the emission areas PXA-R, PXA-G, and PXA-B illustrated in FIG. 5 may be referred to as a pentile structure. However, the arrangement structure of the emission areas PXA-R, PXA-G, and PXA-B in the electronic device according to an embodiment is not necessarily limited to the arrangement structure illustrated in FIG. 5. For example, in an embodiment, the emission areas PXA-R, PXA-G, and PXA-B may have a stripe structure in which the red emission area PXA-R, the green emission area PXA-G, and the blue emission area PXA-B are sequentially alternately arranged along the first directional axis DR1 or the second directional axis DR2.

FIG. 6 is a cross-sectional view illustrating a portion of the electronic device according to an embodiment. The cross-sectional view of FIG. 6 may correspond to a cross-sectional view of a portion of the active area AA (see FIG. 3) of the electronic device ED. The cross-sectional view of FIG. 6 illustrates an example of one emission area PXA of the emission areas PXA-R, PXA-G, and PXA-B illustrated in FIG. 5 and a non-emission area NPXA adjacent to the one emission area PXA.

Referring to FIG. 6, at least one inorganic layer is disposed on a top surface of the base layer BS in the display layer DP. The inorganic layer may include aluminum oxide, titanium oxide, silicon oxide, silicon nitride, and/or silicon oxynitride. The inorganic layer may be provided as a multilayered structure. The multilayered inorganic layer may constitute a barrier layer and/or a buffer layer. In this embodiment, the display panel DP may include a buffer layer BFL.

The buffer layer BFL may increase bonding force between the base layer BS and the semiconductor pattern. The buffer layer BFL may include a silicon oxide layer, a silicon nitride layer, or a silicon oxynitride layer. For example, the buffer layer BFL may be provided by alternately laminating two or more layers selected from the silicon oxide layer, the silicon nitride layer, and the silicon oxynitride layer.

The semiconductor pattern may be disposed on the buffer layer BFL. The semiconductor pattern may include polysilicon. However, the embodiment of the inventive concept is not necessarily limited thereto. For example, the semiconductor pattern may include amorphous silicon or metal oxide.

FIG. 6 illustrates a portion of the semiconductor pattern. For example, the semiconductor pattern may be further disposed on other areas. The semiconductor pattern may be arranged in accordance with a specific rule over the pixels. The semiconductor pattern has different electrical properties depending on whether the semiconductor pattern is doped. The semiconductor pattern may include a first region having high conductivity and a second region having low conductivity. The first region may be doped with an N-type dopant or a P-type dopant. The second region may be referred to as a channel region.

The first region may have conductivity greater than that of the second region and may substantially serve as an electrode or a signal line. The second region may substantially correspond to an active A1 (or channel) of the transistor. For example, a portion of the semiconductor pattern may be an active A1 of the transistor, another portion may be a source or drain of the transistor, and further another portion may be a connection electrode or a connection signal line.

Each of the pixels may have an equivalent circuit including a plurality of transistors, one capacitor, and a light emitting element, and an equivalent circuit diagram of the pixel may be modified in various forms. In FIG. 6, one transistor TR and the light emitting element EMD, that are included in the pixel are exemplarily illustrated.

A source S1, an active A1, and a drain D1 of the transistor TR may be formed from a semiconductor pattern. The source S1 and the drain D1 may extend in opposite directions from the active A1 in a cross-sectional view. FIG. 6 illustrates a portion of a connection signal line SCL formed from the semiconductor pattern. The connection signal line SCL may be connected to the drain D1 of the transistor TR on the plane.

A first insulating layer 10 may be disposed on the buffer layer BFL. The first insulating layer 10 commonly overlaps the plurality of pixels PX to cover the semiconductor pattern. The first insulating layer 10 may include an inorganic layer and/or an organic layer and have a single-layered or multilayered structure. The first insulating layer 10 may include aluminum oxide, titanium oxide, silicon oxide, silicon nitride, and/or silicon oxynitride. In this embodiment, the first insulating layer 10 may include a single-layered silicon oxide layer. The insulating layer of the circuit layer CL, which is described below, as well as the first insulating layer 10 may be an inorganic layer and/or an organic layer and may have a single-layered or a multilayered structure. The inorganic layer may include at least one of the above-described materials, but is not necessarily limited thereto.

The gate G1 of the transistor TR is disposed on the first insulating layer 10. Each of the gates G1 may be a portion of a metal pattern. The gate G1 overlaps the active A1. In the process in which the semiconductor pattern is doped, the gate G1 may function as a mask.

A second insulating layer 20 may be disposed on the first insulating layer 10 to cover the gate G1. A second insulating layer 20 may commonly overlap the pixels. For example, a single second insulating layer 20 may cover all of the pixels. The second insulating layer 20 may be an inorganic layer and/or an organic layer and may have a single-layered or multilayered structure including a silicon oxide layer, a silicon nitride layer, and/or a silicon oxynitride layer.

A third insulating layer 30 may be disposed on the second insulating layer 20 and may have a single-layered or multilayered structure including a silicon oxide layer, a silicon nitride layer, and/or a silicon oxynitride layer.

A first connection electrode CNE1 may be disposed on the third insulating layer 30. The first connection electrode CNE1 may be connected to the signal line SCL through a contact hole CNT-1 passing through the first to third insulating layers 10 to 30.

A fourth insulating layer 40 may be disposed on the third insulating layer 30. The fourth insulating layer 40 may have a single-layered or multilayered structure including a silicon oxide layer, a silicon nitride layer, and/or a silicon oxynitride layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be disposed on the fifth insulating layer 50 to cover the second connection electrode CNE2. The sixth insulating layer 60 may be an organic layer.

The display element layer EDL including the light emitting element EMD may be disposed on the circuit layer CL. The light emitting element EMD may include a first electrode AE, a light emitting layer EL, and a second electrode CE.

The first electrode AE may be disposed on the sixth insulating layer 60. The first electrode AE may be connected to the second connection electrode CNE2 through a contact hole CNT-3 passing through the sixth insulating layer 60.

A pixel defining layer 70 may be disposed on the sixth insulating layer 60 to cover a portion of the first electrode AE. An opening 70-OP is defined in the pixel defining layer 70. The opening 70-OP of the pixel defining layer 70 exposes at least a portion of the first electrode AE. In this embodiment, an emission area PXA may be defined to correspond to a portion of an area of the first electrode AE, that is exposed by the opening 70-OP. A non-emission area NPXA may at least partially surround the emission area PXA. In an embodiment, the pixel defining layer 70 may include a plurality of sub pixel defining layers PDL-L and PDL-U, that are laminated. The sub pixel defining layers PDL-L and PDL-U may be formed in the same patterning process or may be sequentially formed through a separate patterning process. However, in an embodiment, the pixel defining layer 70 may be provided as one layer in which an opening 70-OP is defined.

In an embodiment, the pixel defining layer 70 may be made of a polymer resin. For example, the pixel defining layer 70 may include a polyacrylate-based resin a polyimide-based resin. Also, the pixel defining layer 70 may further include an inorganic material in addition to the polymer resin. The pixel defining layer 70 may include a light absorbing material or include a black pigment or a black dye. The pixel defining layer 70 including the black pigment or the black dye may realize a black pixel defining layer. When the pixel defining layer 70 is formed, the black pigment or the black dye may be used as a carbon black, but the embodiment of the inventive concept is not necessarily limited thereto.

Also, the pixel defining layer 70 may be made of an inorganic material. For example, the pixel defining layer 70 may include silicon nitride ($SiN_x$), silicon oxide ($SiO_x$), oxynitride ($SiO_xN_y$), or the like. The pixel defining layer 70 may define the emission areas PXA-R, PXA-G, and PXA-B. The emission areas PXA-R, PXA-G, and PXA-B and the non-emission area NPXA may be divided by the pixel defining layer 70.

The light emitting layer EL may be disposed on the first electrode AE. The light emitting layer EL may be disposed in the opening 70-OP. For example, the light emitting layer EL may be separated from each of the pixels. When the light emitting layer EL is separated from each of the pixels, each of the light emitting layers EL may emit blue, red, or green light. However, the embodiment of the inventive concept is not necessarily limited thereto. For example, the light emitting layer EL may be commonly provided to be connected to the pixels. In this case, the light emitting layer EL may provide blue light or white light. The light emitting layer EL may include an organic light emitting material or a quantum dot material.

The second electrode CE may be disposed on the light emitting layer EL. The second electrode CE may have an integrated shape (e.g., the second electrode may be formed from a singular uninterrupted structure) and may be commonly disposed on the plurality of pixels.

A hole transport region may be disposed between the first electrode AE and the light emitting layer EL. The hole transport region may be commonly disposed in the emission area PXA and the ion-emission area NPXA. The hole transport region may include a hole transport layer and may further include a hole injection layer. An electron transport region may be disposed between the light emitting layer EL and the second electrode CE. The electron transport region may include an electron transport layer and may further include an electron injection layer. The hole transport region and the electron transport region may be defined as a common layer on the plurality of pixels. However, the embodiment of the inventive concept is not necessarily limited thereto, and the hole transport region and the electron transport region may also be patterned to correspond to the emission area PXA.

The encapsulation layer TFE may be disposed on the display element layer EDL. The encapsulation layer TFE may be disposed on the second electrode CE.

The sensor layer TP may include a sensor base layer BS-TP, a first conductive layer ML1, an inorganic insulating layer IPV, and a second conductive layer ML2. An organic insulating layer may be further included on the second conductive layer ML2.

The sensor base layer BS-TP may be an inorganic layer including silicon nitride, silicon oxynitride, and/or silicon oxide. Alternatively, the sensor base layer BS-TP may be an organic layer including an epoxy resin, an acrylic resin, or an imide-based resin. The sensor base layer BS-TP may have a single-layered structure or a multilayered structure in which a plurality of layers are laminated along the third directional axis DR3. In one embodiment, the sensor base layer BS-TP may be omitted. Here, the first conductive layer ML1 may be disposed directly on the encapsulation layer TFE.

Each of the first conductive layer ML1 and the second conductive layer ML2 may have a single-layered structure or a multilayered structure in which a plurality of layers are laminated along the third directional axis DR3. Each of the single-layered conductive layers ML1 and ML2 may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), indium zinc tin oxide (IZTO), and the like. Also, the transparent conductive layer may include a conductive polymer such as PEDOT, a metal nanowire, graphene, and the like.

The multilayered conductive layers ML1 and ML2 may include metal layers. The metal layers may have, for example, a three-layered structure of titanium (Ti)/aluminum (Al)/titanium (Ti). The multilayered conductive layers ML1 and ML2 may include at least one metal layer and at least one transparent conductive layer.

The inorganic insulating layer IPV may include aluminum oxide, titanium oxide, silicon oxide, silicon nitride, and/or silicon oxynitride.

in the emission area PXA disposed on the active area, the filter layer CF may be disposed on the sensor layer TP. The filter layer CF may include a light blocking part BM (e.g., a black matrix) and a color filter part CF-P disposed on the light blocking part BM. The filter layer CF may be disposed directly on the sensor layer TP. The light blocking part BM may be disposed at a position corresponding to the pixel defining layer 70.

FIG. 7 is a cross-sectional view illustrating a portion of the electronic device according to an embodiment. FIG. 7 is a cross-sectional view illustrating a portion corresponding to line II-II' of FIG. 5. FIG. 7 is a view illustrating an example of a cross-section of the plurality of emission areas adjacent to each other. The description of the emission areas described with reference to FIG. 6 may be equally applied to the plurality of light emitting areas illustrated in FIG. 7.

Referring to FIG. 7, each of the emission areas PXA-R, PXA-G, and PXA-B may be an area divided by the pixel defining layer 70. The non-emission areas NPXA may be areas between the emission areas PXA-R, PXA-G, and PXA-B adjacent to each other and may correspond to the pixel defining layer 70. In this specification, each of the emission areas PXA-R, PXA-G, and PXA-B may correspond to a pixel. The pixel defining layer 70 may divide light emitting elements EMD-R, EMD-G, and EMD-B. Light emitting layers EL-R, EL-G, and EL-B of the light-emitting elements EMD-R, EMD-G, and EMD-B may be disposed in an opening defined by the pixel defining layer 70. The light emitting layers EL-R, EL-G, and EL-B may be portions that emit red, green, and blue light, respectively.

The filter layer CF may include a color filter part CF-P and a light blocking part BM. Also, the filter layer CF may further include a filter cover layer OC disposed on the color filter part CF-P. The color filter part may include a red filter part CF-R, a green filter part CF-G, and a blue filter part CF-B. The red filter part CF-R, the green filter part CF-G, and the blue filter part CF-B may be portions corresponding to the red emission area PXA-R, the green emission area PXA-G, and the blue emission area PXA-B, respectively.

The red filter part CF-R may transmit red light, the green filter part CF-G may transmit green light, and the blue filter part CF-B may transmit blue light. Each of the red filter part CF-R, the green filter part CF-G, and the blue filter part CF-B may include a polymer photosensitive resin and a pigment or dye. The red filter part CF-R may include a red pigment or dye, the green filter part CF-G may include a green pigment or dye, and the blue filter part CF-B may include a blue pigment or dye.

However, the embodiment of the inventive concept is not necessarily limited thereto. For example, the blue filter part CF-B might not include the pigment or dye. The blue filter part CF-B may include a polymer photosensitive resin and might not include the pigment or dye. The blue filter part CF-B may be transparent. The blue filter part CF-B may be made of a transparent photosensitive resin.

The light blocking part BM may be disposed on the sensor layer TP and may overlap a boundary of the color filter parts CF-P adjacent to each other. Edges of the color filter parts CF-P adjacent to each other may overlap each other. For example, the green filter part CF-G and the red filter part CF-R may overlap each other on the light blocking part BM, or the green filter part CF-G and the blue filter part CF-B may be overlap each other on the light blocking part BM. The light blocking part BM may prevent light from leaking and may divide a boundary between the color filter parts CF-R, CF-G, and CF-B adjacent to each other.

The light blocking part BM may be a black matrix. The light blocking part BM may include an organic pigment or dye. The light blocking part BM may include an organic light blocking material or an inorganic light blocking material including a black pigment or dye. The light blocking part BM may be made of a light blocking composition including propylene glycol monomethyl ether acetate, 3-methoxybutyl acetate, and an organic black pigment.

The light blocking part BM made of the light blocking composition may have optical density of about 1.63. Here, the optical density is expressed by measuring transmittance of light at a wavelength of about 550 nm with respect to the light blocking part BM having a thickness of about 1.48 μm. In an embodiment, the transmittance of the light blocking part BM may be about 0.01% or less. Here, the transmittance corresponds to light transmittance at a wavelength of about 365 nm. However, the embodiment of the inventive concept is not necessarily limited thereto, and the light blocking composition forming the light blocking part BM may be used without limitation as long as the light blocking, composition has low transmittance of visible light and high optical density.

The filter cover layer OC may be disposed on the color filter part CF-P. The filter cover layer OC may be disposed on the color filter part CF-P to protect the color filter part CF-P and planarize a top surface of the filter layer CF. The filter cover layer OC may be an organic material layer including at least one organic material such as an acrylic resin, an epoxy resin, or a silicone resin, or an inorganic material layer including at least one inorganic material such as silicon nitride, silicon oxide, or silicon oxynitride. The filter cover layer OC may be provided as a single layer or a plurality of layers.

Figure 8:
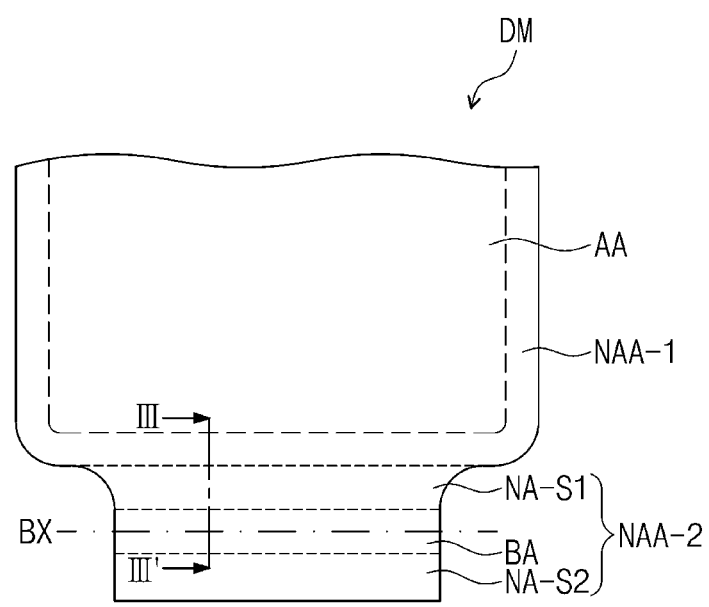
FIG. 8 is a plan view illustrating a portion of a display module according to an embodiment.
Figure 8:
Figure 9:
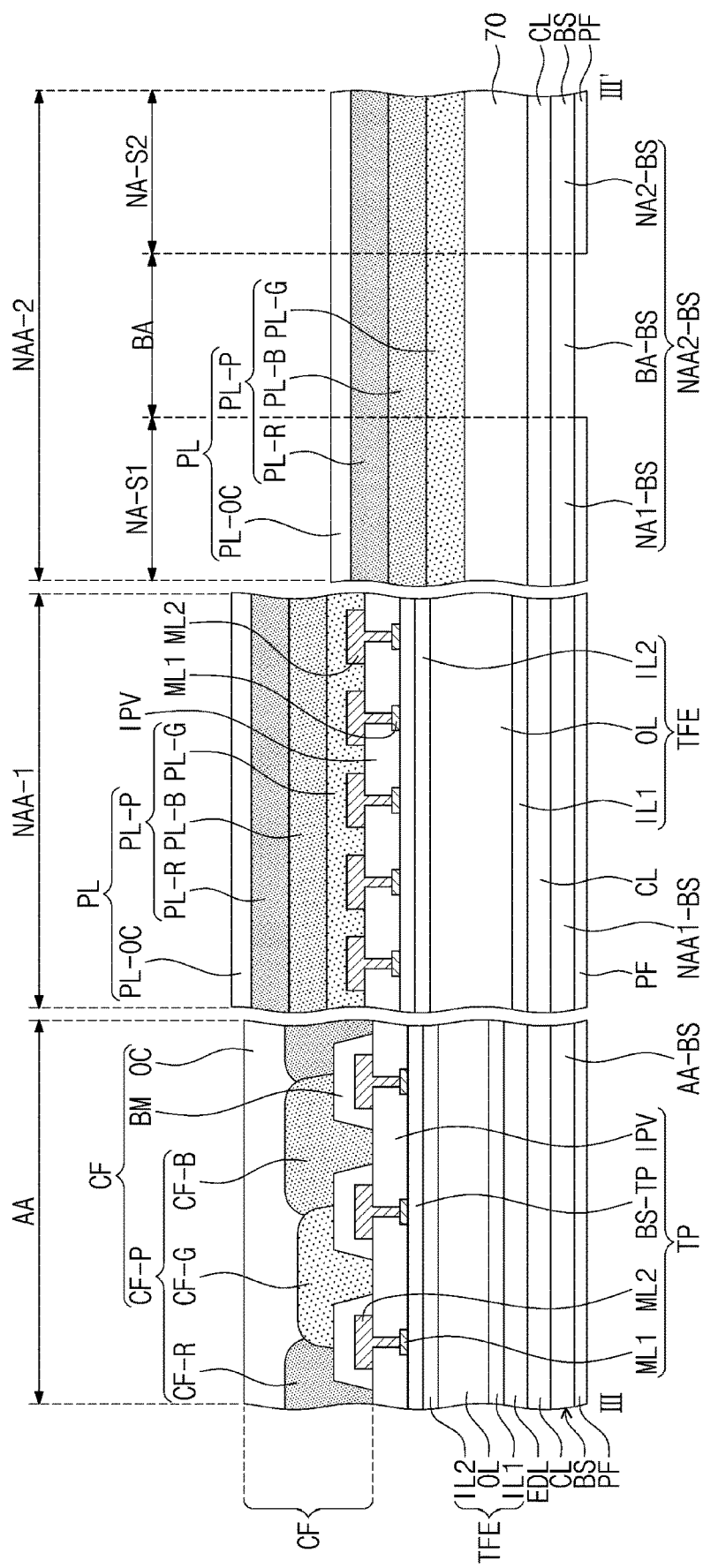
FIG. 9 is a cross-sectional view illustrating a portion of the display module according to an embodiment.

FIG. 8 is a plan view illustrating a portion of the display module according to an embodiment. FIG. 9 is a cross-sectional view illustrating a portion of the display module according to an embodiment. FIG. 8 illustrates a plan view of a portion of the display module DM, and FIG. 9 illustrates a cross-sectional view of a portion taken along line III-III' of FIG. 8.

Referring to FIGS. 8 and 9, the display module DM may include an active area AA and a peripheral area NAA adjacent to an outer periphery of the active area AA. The peripheral area NAA may include a first peripheral portion NAA-1 and a second peripheral portion NAA-2. The first peripheral portion NAA-1 may be a portion adjacent to the active area AA, and the second peripheral portion NAA-2 may be a portion adjacent to the first peripheral portion NAA-1. The second peripheral portion NAA-2 may be a portion spaced apart from the active area AA. The second peripheral portion NAA-2 may include a bent portion BA. The bent portion BA may be a portion that is bent with respect to a virtual bending axis BX extending in the direction of the second directional axis DR2, that is one direction. The support layer PF may be removed from the bent portion BA of the display module DM according to an embodiment.

In the display module, according to an embodiment, the active area AA may include a display layer DP, a sensor layer TP, and a filter layer CF, that are sequentially laminated. The display layer DP may include a display element layer EDL. The first peripheral portion NAA-1 may be a portion adjacent to the active area AA and may include a protection layer PL disposed on the sensor layer TP. The first peripheral portion NAA-1 might not include the display element layer EDL. The second peripheral portion NAA-2 may be a portion that does not include the display element layer EDL and the sensor layer TP. The second peripheral portion NAA-2 may include a protection layer PL disposed on the base layer BS.

Also, in one embodiment, the base layer BS may include an active area AA-BS, a first peripheral portion NAA1-BS, and a second peripheral portion NAA2-BS, and a second peripheral portion NAA2-BS may include a first sub peripheral portion NA1-BS, a bent portion BA-BS, and a second sub peripheral portion NA2-BS. The active area AA-BS, the first peripheral portion NAA1-BS, and the second peripheral portion NAA2-BS of the base layer BS may be portions disposed corresponding to the active area AA, the first peripheral portion NAA-1, and the second peripheral portion NAA-2 of the display module, respectively.

The display layer DP disposed on the active area AA-BS of the base layer BS and including the display element layer EDL, the sensor layer TP disposed on the display layer DP, and the filter layer CF disposed on the sensor layer TP may be provided on the active area AA.

The sensor layer TP disposed on the first peripheral portion NAA-1 of the base layer BS and the protection layer PL disposed on the sensor layer TP may be provided on the first peripheral portion NAA-1. The display element layer EDL might not overlap the first peripheral portion NAA1-BS of the base layer BS. In an embodiment, the protection layer PL disposed on the first peripheral portion NAA-1 might not overlap the display element layer EDL.

The second peripheral portion NAA-2 may be provided with a second peripheral portion NAA2-BS of the base layer BS and a protection layer PL disposed on the second peripheral portion NAA2-BS of the base layer BS. The second peripheral portion NAA2-BS of the base layer BS might not overlap the display element layer EDL and the sensor layer TP. In an embodiment, the protection layer PL disposed on the second peripheral portion NAA-2 might not overlap the display element layer EDL and the sensor layer TP.

In the first peripheral portion NAA-1, the protection layer PL may be disposed directly on the sensor layer TP. For example, in the first peripheral portion NAA-1, the protection layer PL may cover the second conductive layer ML2.

In the second peripheral portion NAA-2, the protection layer PL may be disposed on a pixel defining layer 70. The pixel defining layer 70 disposed on the second peripheral portion NAA-2 may be formed in the same process as the pixel defining layer 70 (see FIG. 7) included in the display element layer EDL of the active area AA. For example, in an embodiment, the pixel defining layer 70 may include a black pigment or dye.

Figure 10:
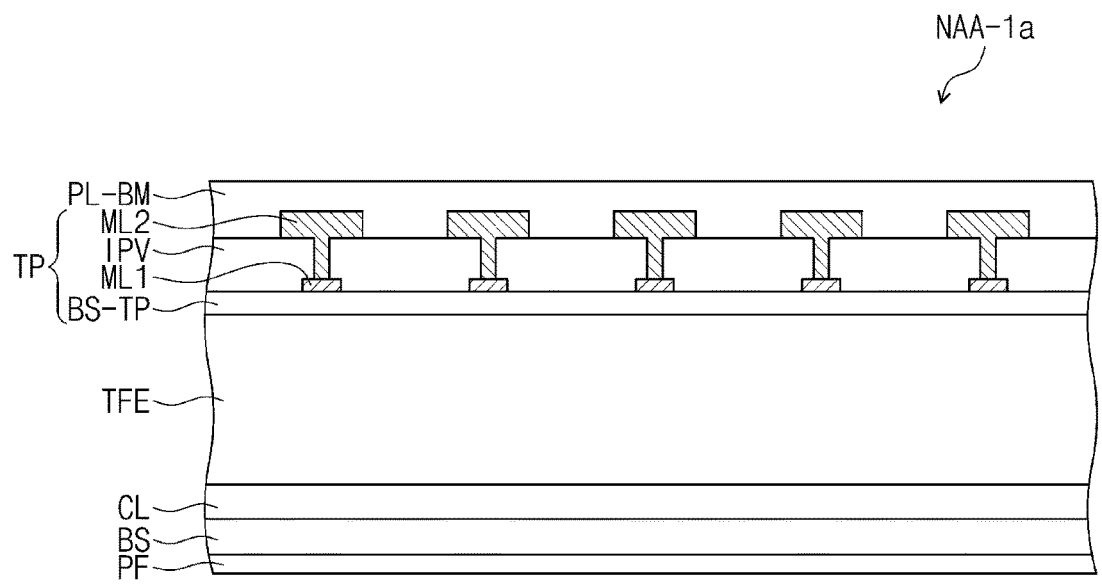
FIG. 10 is a cross-sectional view illustrating a portion of the display module according to an embodiment.

In an embodiment, the protection layer PL disposed on the peripheral area NAA may include a color protection part PL-P and/or a light blocking protection part PL-BM (see FIG. 10). FIG. 9 illustrates the protection layer PL including the color protection part PL-P.

Referring to FIG. 9, the protection layer PL may include a green protection part PL-G, a blue protection part PL-B, and a red protection part PL-R. In an embodiment, the green protection part PL-G, the blue protection part PL-B, and the red protection part PL-R may be sequentially laminated. The green protection part PL-G, the blue protection part PL-B, and the red protection part PL-R of the protection layer PL may be provided through the same processes as the green filter part CF-G, the blue filter part CF-B, and the red filter part CF-R of the filter layer CF, respectively.

Each of the green protection part PL-G, the blue protection part PL-B, and the red protection part PL-R may include a polymer photosensitive resin and a pigment or dye. The green protection part PL-G may include a green pigment or dye, the blue protection part PL-B may include a blue pigment or dye, and the red protection part PL-R may include a red pigment or dye.

In one embodiment, the green protection part PL-G and the green filter part CF-G may be made of the same material, the blue protection part PL-B and the blue filter part CF-B may be made of the same material, and the red protection part PL-R and the red filter part CF-R may be made of the same material.

In an embodiment, the protection layer PL may further include a cover protection layer PL-OC. The cover protection layer PL-OC may be disposed on the color protection part PL-P. The cover protection layer PL-OC may be disposed on the color protection part PL-P to protect the color protection part PL-P and planarize a top surface of the protection layer PL. The cover protection layer PL-OC may be an organic material layer including at least one organic material such as an acrylic resin, an epoxy resin, or a silicone resin, or an inorganic material layer including at least one inorganic material such as silicon nitride, silicon oxide, or silicon oxynitride. The cover protection layer PL-OC may be provided as a single layer or a plurality of layers. In an embodiment, the cover protection layer PL-OC may be made of the same material as the filter cover layer OC of the filter layer CF. For example, the cover protection layer PL-OC may be formed through the same process as the filter cover layer OC of the filter layer CF.

Figure 11:
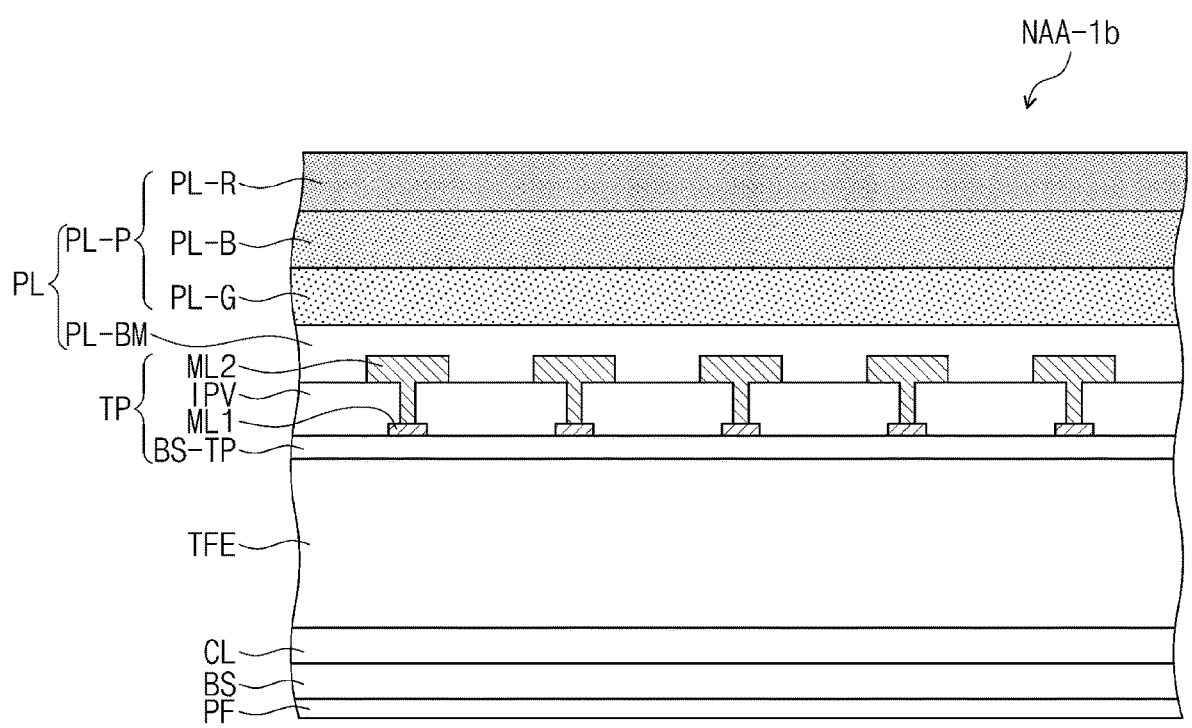
FIG. 11 is a cross-sectional view illustrating a portion of the display module according to an embodiment.

FIGS. 10 and 11 are cross-sectional views illustrating a portion of the display module according to an embodiment. FIGS. 10 and 11 illustrate portions corresponding to the first peripheral portion NAA-1 in an embodiment described with reference to FIGS. 8 and 9, respectively. In an embodiment described with reference to FIGS. 10 and 11, the same contents as those described with reference to FIGS. 1 to 9 may be applied to the remaining parts except for the constituents of the first peripheral portion.

Referring to FIG. 10, in an embodiment, a first peripheral portion NAA-1a may include a light blocking protection part PL-BM as a protection layer. The light blocking protection part PL-BM may be disposed on the sensor layer TP. The light blocking protection part PL-BM may cover the second conductive layer ML2. The light blocking protection part PL-BM may be formed through the same process as the light blocking part BM (see FIG. 9) included in the filter layer CF (see FIG. 9) disposed on the active area AA (see FIG. 9). In an embodiment, the light blocking protection part PL-BM may be made of the same material as the light blocking part BM.

The light blocking protection part PL-BM may include an organic pigment or dye. The light blocking protection part PL-BM may include an organic light blocking material or an inorganic light blocking material including a black pigment or dye. The light blocking protection part PL-BM may be made of a light blocking composition including propylene glycol monomethyl ether acetate, 3-methoxybutyl acetate, and an organic black pigment. The light blocking protection part PL-BM made of the light blocking composition may have optical density of about 1.63 at a wavelength of about 550 nm. Here, the optical density may be a specific value for the light blocking protection layer having a thickness of about 1.48 μm. In an embodiment, transmittance of the light blocking protection part PL-BM at a wavelength of about 365 nm may be about 0.01% or less. However, the embodiment of the inventive concept is not necessarily limited thereto, and the light blocking composition forming the light blocking protection part PL-BM may be used without limitation as long as the light blocking composition has low transmittance and high optical density.

Referring to FIG. 11, in an embodiment, the first peripheral portion NAA-1b may include both the light blocking protection part PL-BM and the color protection part PL-P as the protection layer PL. In an embodiment, the protection layer PL may include the light blocking protection part PL-BM disposed adjacent to the sensor layer TP and the color protection part PL-P disposed on the light blocking protection part PL-BM. For example, in an embodiment, the protection layer PL may include the light blocking protection part PL-BM, the green protection part PL-G, the blue protection part PL-B, and the red protection part PL-R, that are sequentially laminated. The light blocking protection part PL-BM, the green protection part PL-G, the blue protection part PL-B, and the red protection part PL-R, that are sequentially laminated, may be formed through the same processes as the light blocking part BM (see FIG. 9) and the color filter part CF-P (see FIG. 9) included in the filter layer CF (see FIG. 9) disposed on the active area. AA (see FIG. 9). In an embodiment, the light blocking protection part PL-BM may be made of the same materials as the light blocking part BM, and the green protection part PL-G, the blue protection part PL-B, and the red protection part PL-R may be made of the same materials as the green filter part CF-G, the blue filter part CF-B, and the red filter part CF-R, that are illustrated in FIG. 9, respectively.

The cover protection layer PL-OC (see FIG. 9) may be disposed on the color protection part PL-P even in the embodiment illustrated in. FIGS. 10 and 11.

Referring to FIGS. 9 to 11, the electronic device, according to an embodiment, may include the light blocking protection part PL-BM and/or the color protection part PL-P on the peripheral area. The electronic device, according to an embodiment, may include the color protection part PL-P on the peripheral area, the light blocking protection part PL-BM on the peripheral area, or all of the light blocking protection part PL-BM and the color protection part PL-P on the peripheral area. For example, the electronic device, according to an embodiment, includes the light blocking protection part PL-BM and/or the color protection part PL-P, that are disposed on the first peripheral portion NAA-1 adjacent to the active area to prevent the constituents such as the sensor layer TP and the display layer DP, disposed on the first peripheral portion NAA-1, from being visually recognized from the outside. Also, the electronic device, according to an embodiment, includes the light blocking protection part PL-BM and/or the color protection part PL-P, that are formed through the same process as the filter layer CF of the active area AA to protect the constituents such as the sensor layer TP and the display layer DP, that are disposed on the first peripheral portion NAA-1, and cover the lower constituents of the first peripheral portion NAA-1 without adding a separate light blocking member.

Figure 12:
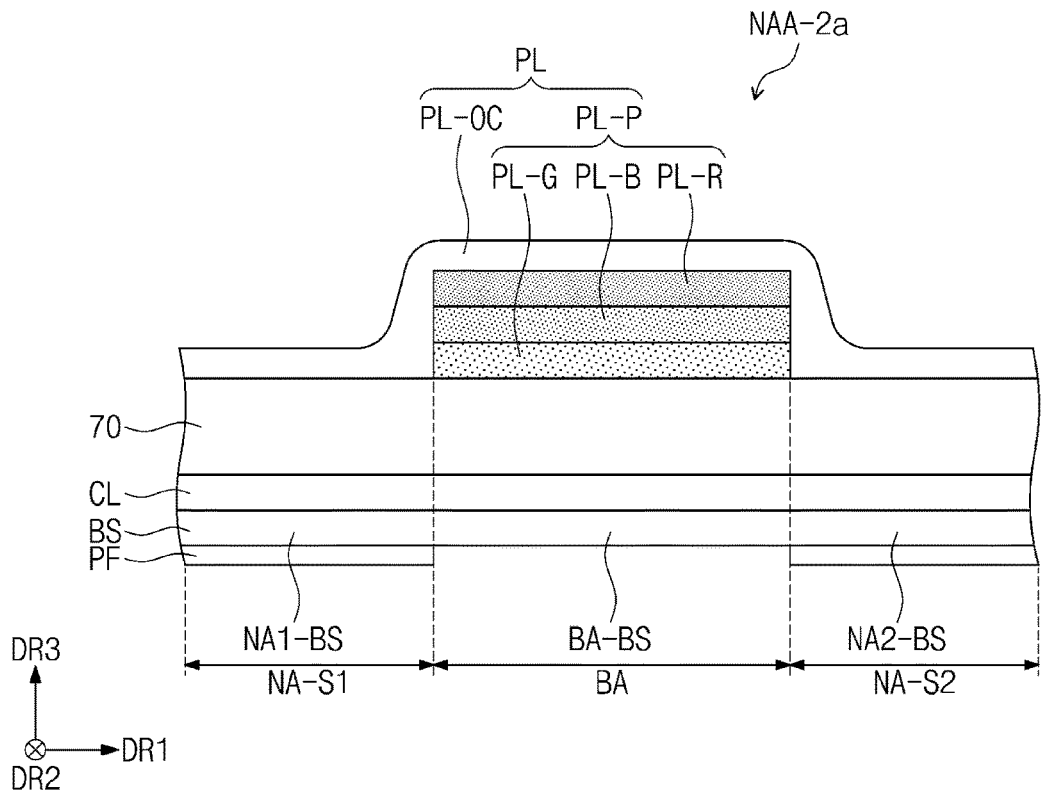
FIG. 12 is a cross-sectional view illustrating a portion of the display module according to an embodiment.
Figure 13:
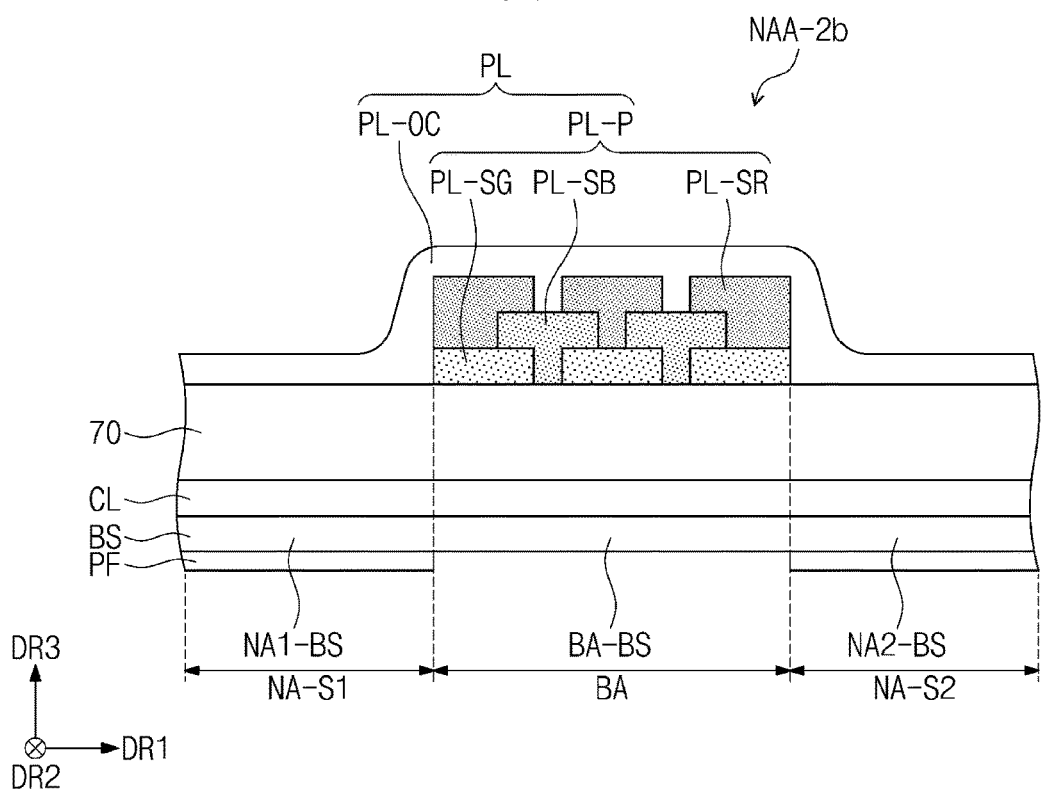
FIG. 13 is a cross-sectional view illustrating a portion of the display module according to an embodiment.

FIGS. 12 and 13 are cross-sectional views illustrating a portion of the display module according to an embodiment. FIGS. 12 and 13 illustrate portions corresponding to the second peripheral portion NAA-2 in an embodiment described with reference to FIGS. 8 and 9, respectively. In an embodiment described with reference to FIGS. 12 and 13, the same contents as those described with reference to FIGS. 1 to 9 may be applied to the remaining parts except for the constituents of the second peripheral portion.

Referring to FIG. 12, in an embodiment, the color protection part PL-P of the protection layer may overlap the bent portion BA on the second peripheral portion NAA-2a. Referring to FIG. 12, the color protection part PLP may overlap the bent portion BA-BS of the base layer and might not overlap the first sub peripheral portion NA1-BS and the second sub peripheral portion NA2-BS of the base layer. In an embodiment, the support layer PF may overlap the first sub peripheral portion NA1-BS and the second sub peripheral portion NA2-BS of the base layer and might not overlap the bent portion BA-BS.

Referring to FIG. 12, in an embodiment, the color protection part PL-P may be disposed directly on the pixel defining layer 70. In an embodiment, the color protection part PL-P may overlap the bent portion BA-BS of the base layer and may include a green protection part PL-G, a blue protection part PL-B, and a red protection part PL-R, that are sequentially laminated. The green protection part PL-G, the blue protection part PL-B, and the red protection part PL-R, that are sequentially laminated, may be formed through the same processes as the green filter part CF-G, the blue color filter part CF-B, and the red filter part CF-R, that are illustrated in FIG. 9, respectively. Also, the green protection part PL-G, the blue protection part PL-B, and the red protection part PL-R, that are sequentially laminated, may be made of the same materials as the green filter part CF-G, the blue color filter part CF-B, and the red filter part CF-R, that are illustrated in FIG. 9, respectively.

Referring to FIG. 13, in one embodiment, the color protection part PL-P may include a plurality of sub green protection parts PL-SG spaced apart from each other on the plane, a plurality of sub blue protection parts PL-SB spaced apart from each other on the plane, and a plurality of sub red protection parts PL-SR spaced apart from each other on the plane, that overlap the bent portion BA-BS of the base layer. In an embodiment, the plurality of sub green protection parts PL-SG, the plurality of sub blue protection parts PL-SB, and the plurality of sub red protection parts PL-SR may be spaced apart from each other on a plane parallel to the plane defined by the first directional axis DR1 and the second directional axis DR2. In an embodiment, the sub green protection parts PL-SG, the sub blue protection parts PL-SB, and the sub red protection parts PL-SR at least partially overlap the sub protection parts having different colors.

Referring to FIG. 13, in an embodiment, the color protection part PL-P may be disposed directly on the pixel defining layer 70. In an embodiment, the color protection part PL-P may include the sub green protection part PL-SG, the sub blue protection part PL-SB, and the sub red protection part PL-SR, that overlap the bent portion BA-BS of the base layer and are sequentially provided. The sub green protection part PL-SG, the sub blue protection part PL-SB, and the sub red protection part PL-SR provided sequentially may be formed through the same processes as the green filter part CF-G, the blue filter part CF-B, and the red filter part CF-R, that are illustrated in FIG. 9, respectively. Also, the sub green protection part PL-SG, the sub blue protection part PL-SB, and the sub red protection part PL-SR provided sequentially may be made of the same materials as the green filter part CF-G, the blue filter part CF-B, and the red filter part CF-R, that are illustrated in FIG. 9, respectively.

Referring to FIGS. 12 and 13, the cover protection layer PL-OC may be disposed on the color protection part PL-P. The cover protection layer PL-OC may cover the color protection part PL-P and may be disposed over the second peripheral portions NAA-2a and NAA-2b. In FIGS. 12 and 13, the color protection part PL-P is illustrated to overlap only the bent portion BA-BS of the base layer, but the embodiment of the inventive concept is not necessarily limited thereto. For example, the color protection part PL-P may overlap the bent portion BA-BS of the base layer, a portion of the first sub peripheral portion NA1-BS adjacent to the bent portion BA-BS, and a portion of the second sub peripheral portion NA2-BS adjacent to the bent portion BA-BS.

Referring to FIGS. 9, 12, and 13, the electronic device, according to an embodiment, may include a protection layer including the color protection part on the peripheral area. For example, the electronic device according to an embodiment may include the protection layer PL disposed on the second peripheral portion NAA-2 spaced apart from the active area AA to prevent a partial constituent such as the display layer DP disposed on the second peripheral portion NAA-2 from being visually recognized from the outside. Also, the electronic device, according to an embodiment, may include the protection layer PL formed through the same process as the filter layer CF of the active area AA to protect the constituent such as the display layer disposed on the second peripheral portion NAA-2 without adding a separate member for protecting the bent portion, and in particularly, cover and protect the bent portion.

Figure 14A:
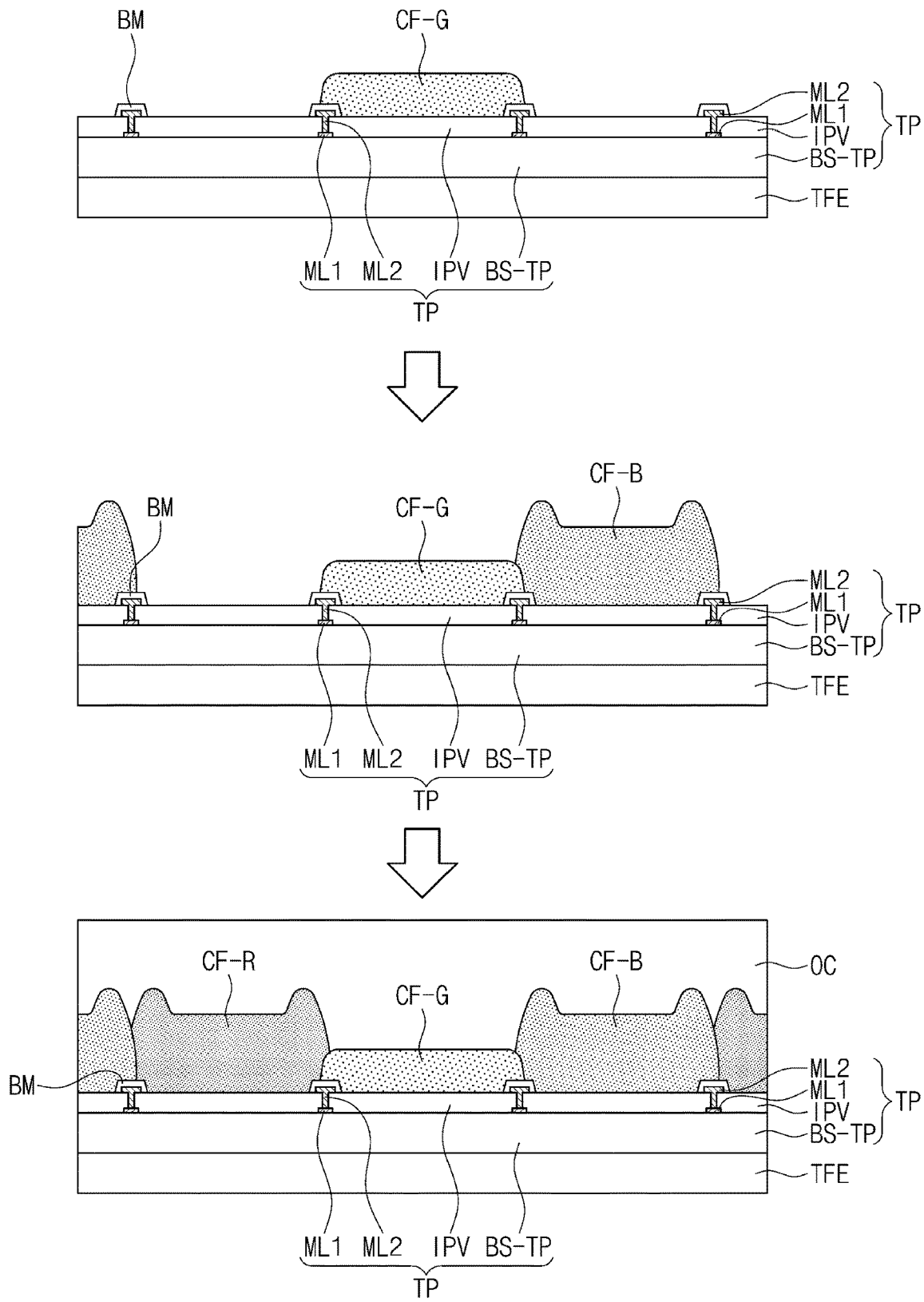
FIG. 14A is a schematic view illustrating a portion of processes of manufacturing an electronic device according to an embodiment.

FIGS. 14A to 16 are schematic views illustrating a portion of processes of manufacturing an electronic device according to an embodiment. FIG. 14A illustrates a process of manufacturing a portion of an active area in an electronic device according to an embodiment, and FIGS. 14B to 16 illustrate a process of manufacturing a portion of a peripheral area in the electronic device according to an embodiment.

FIG. 14A is a view sequentially illustrating processes of manufacturing a filter layer CF provided on the active area. Referring to FIG. 14, in the filter layer CF, a light blocking part BM may be disposed on a second conductive layer ML2, and a green filter part CF-G may be provided on a sensor layer TP. The green filter part CF-G may be provided by being patterned on a portion of the sensor layer TP. After the patterned green filter part CF-G is provided, a blue filter part CF-B may be provided. An edge portion of the blue filter part CF-B may be patterned to overlap the edge portion of the green filter part CF-G. Next, a red filter part CF-R may be provided. An edge portion of the red filter part CF-R may be patterned to overlap the edge portion of the green filter part CF-G or overlap the edge portion of the blue filter part CF-B. A boundary of the filter parts having different colors may overlap the light blocking part BM.

Figure 14B:
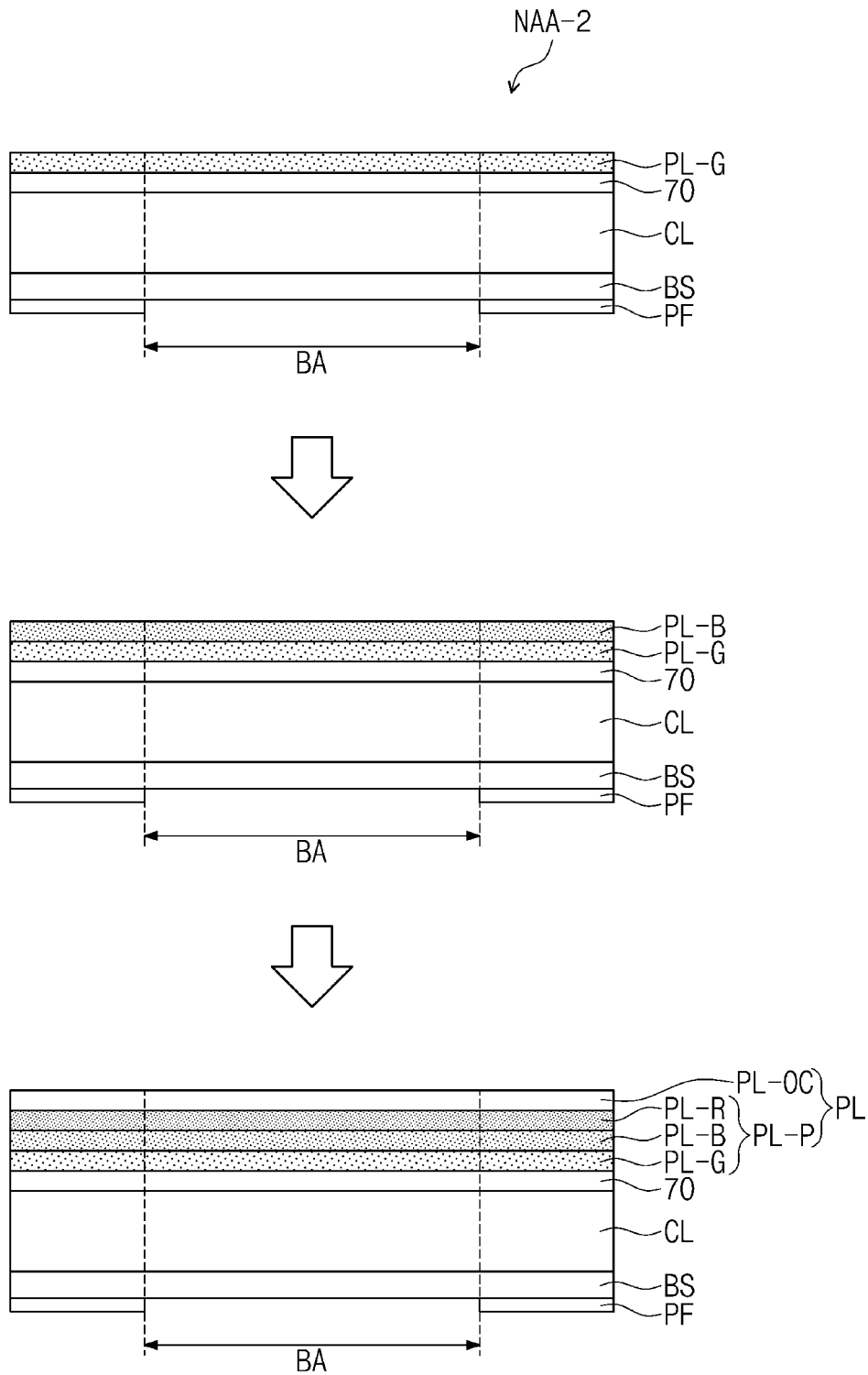
FIG. 14B is a schematic view illustrating a portion of processes of manufacturing an electronic device according to an embodiment.

FIG. 14B is a view sequentially illustrating processes of manufacturing a protection layer PL provided on the peripheral area. FIG. 14B is a view illustrating an example of the process of manufacturing the protection layer disposed on a second peripheral portion NAA-2 of FIG. 9 according to the embodiment. Referring to FIG. 14B, a green protection part PL-G, a blue protection part PL-B, and a red protection part PL-R may be sequentially provided. Each of the green protection part PL-G, the blue protection part PL-B, and the red protection part PL-R may be provided as one layer over the entire second peripheral portion NAA-2. For example, in an embodiment, the green protection part PL-G, the blue protection part PL-B, and the red protection part PL-R may be provided to cover the entire second peripheral portion NAA-2 including the bent portion BA. The green protection part PL-G, the blue protection part PL-B, and the red protection part PL-R may be provided through the same processes as the green filter part CF-G, the blue filter part CF-B, and the red filter part CF-R, that are illustrated in FIG. 14A, respectively.

In FIG. 14B, the process of manufacturing the protection layer PL provided on the second peripheral portion NAA-2 of the peripheral area is illustrated as an example, but the protection layer PL provided on the first peripheral portion NAA-1 (see FIG. 9) may be provided through the same process as the manufacturing process described in FIG. 14B except for a position at which the protection layer PL is disposed.

Figure 15:
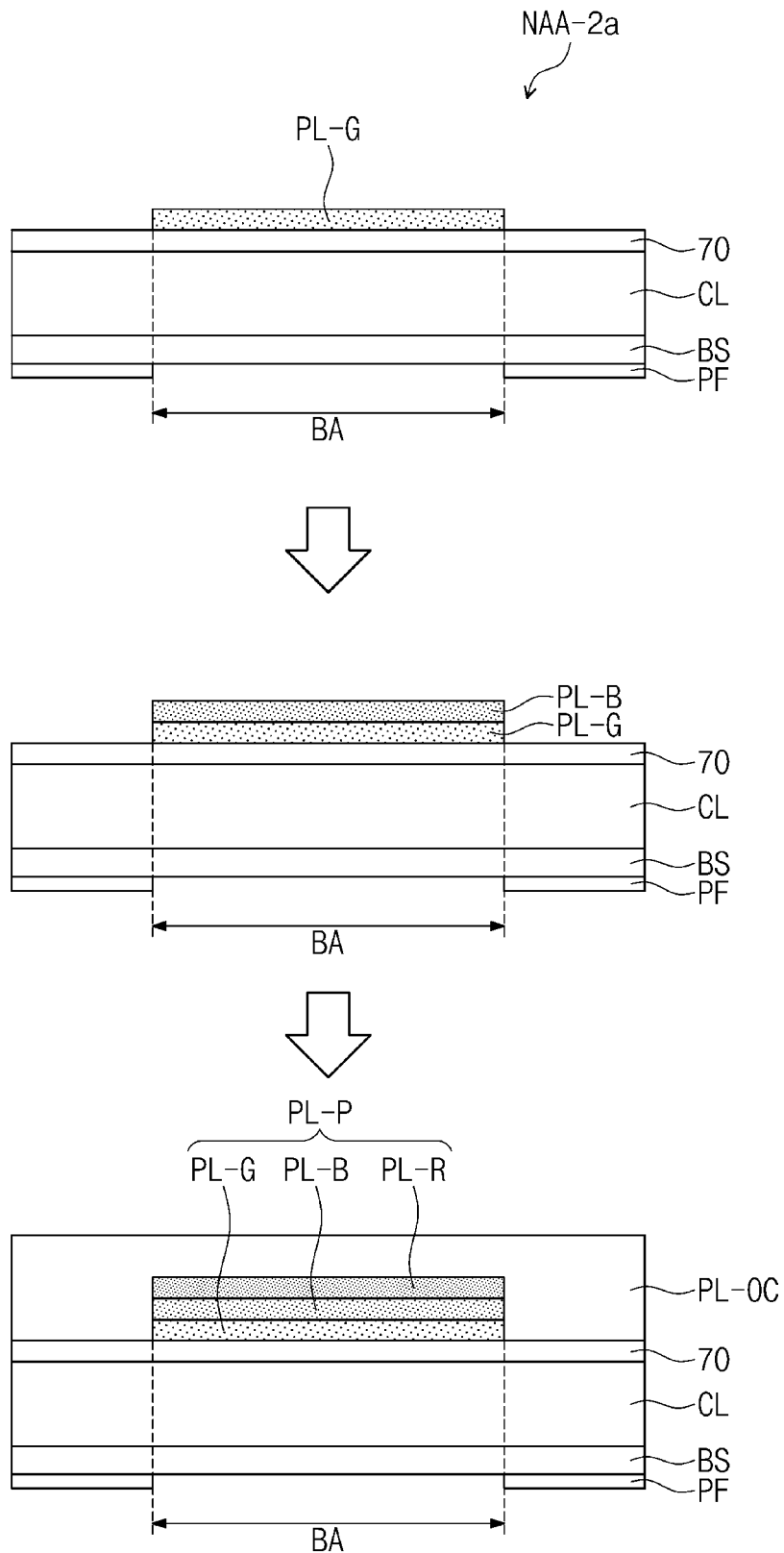
FIG. 15 is a schematic view illustrating a portion of processes of manufacturing an electronic device according to an embodiment.

FIG. 15 is a view illustrating an example of the process of manufacturing the electronic device including the above-described constituents on the peripheral area of FIG. 12 according to an embodiment. Referring to FIG. 15, the green protection part PL-G, the blue protection part PL-B, and the red protection part PL-R correspond to the bent portion BA of the second peripheral portion NAA-2a may be sequentially laminated and provided. The cover protection layer PL-OC may cover the color protection part PL-P and may be disposed over the second peripheral portion NAA-2a. The green protection part PL-G, the blue protection part PL-B, and the red protection part PL-R may be provided, through the same processes as the green filter part CF-G, the blue filter part CF-B, and the red filter part CF-R, that are illustrated in FIG. 14A, respectively.

Figure 16:
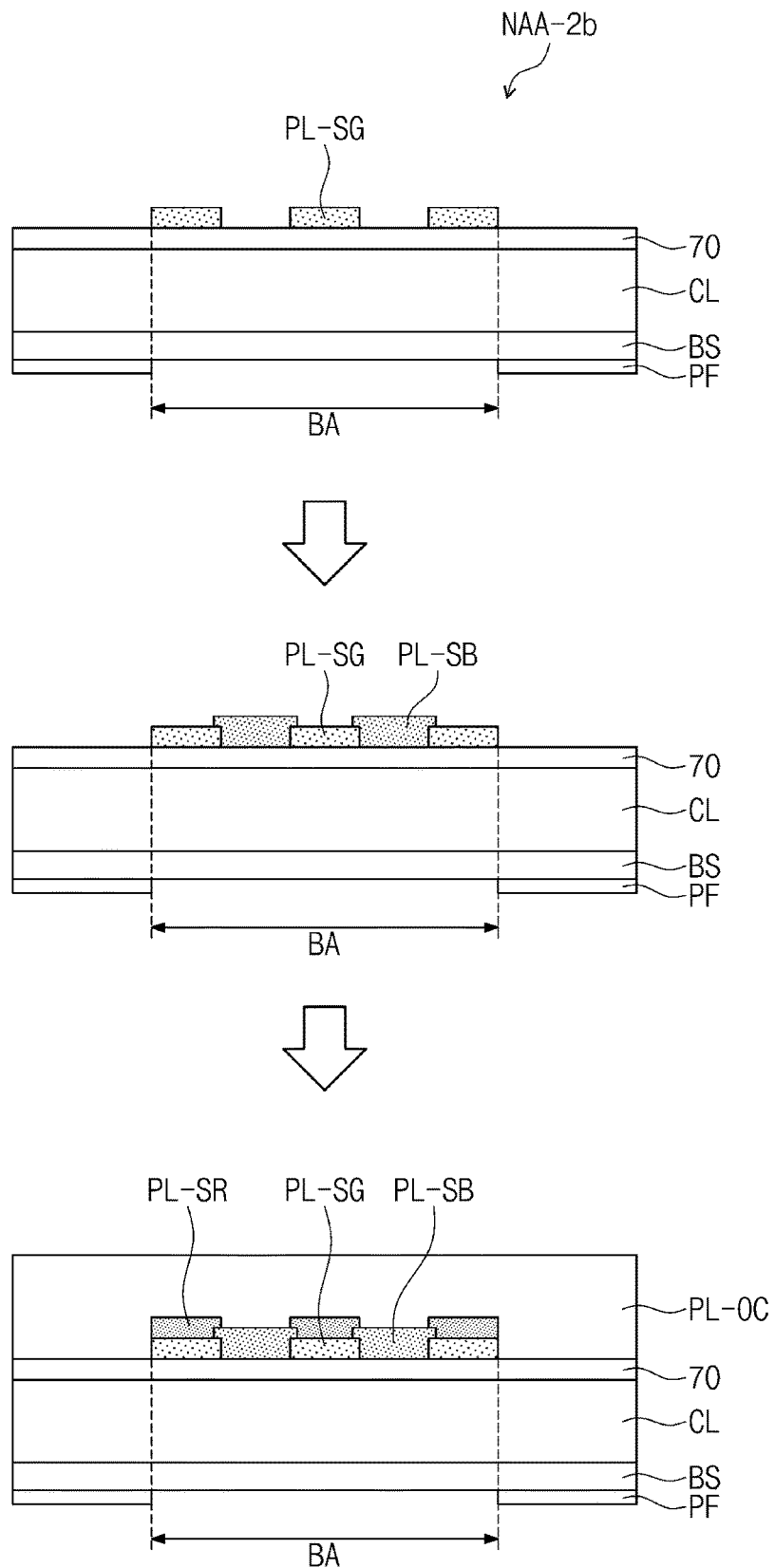
FIG. 16 is a schematic view illustrating a portion of processes of manufacturing an electronic device according to an embodiment.

FIG. 16 is a view illustrating an example of the process of manufacturing the electronic device including the above-described constituents on the peripheral area of FIG. 13 according to an embodiment. Referring to FIG. 16, a sub green protection part PL-SG, a sub blue protection part PL-SB, and a sub red protection part PL-SR may be sequentially patterned and provided to correspond to the bent portion BA of the second peripheral portion NAA-2b. The cover protection layer PL-OC may cover the color protection part PL-P and may be disposed over the second peripheral portion NAA-2a. The sub green protection part PL-SG, the sub blue protection part PL-SB, and the sub red protection part PL-SR may be provided through the same processes as the green filter part CF-G, the blue filter part CF-B, and the red filter part CF-R, that are illustrated in FIG. 14A, respectively.

The electronic device according to an embodiment may include the protection layer disposed on the peripheral area outside the active area and including the light blocking protection part and/or the color protection part to allow the protection layer to serve as the light blocking member, thereby providing increased process productivity except that the separate light blocking member is provided. In addition, the electronic device, according to an embodiment, may include the protection layer disposed on the bent portion of the peripheral area and including the light blocking protection part and/or the color protection part to realize increased reliability without adding the separate bending protection member.

In the embodiment, the light blocking protection part and/or the color protection part may be disposed on the peripheral area that is provided on at least one side of the active area to provide the electronic device excluding the arrangement of the separate light blocking pattern that covers the peripheral area.

The electronic device, according to the embodiment, may include the protection layer that is provided through the same process as the color filter parts provided on the active area, and the protection layer may cover the bent portion of the display module to increase the reliability.

It will be apparent to those skilled in the art that various modifications and deviations can be made in the present invention. Thus, it is intended that the present disclosure covers the modifications and deviations of this invention.

What is claimed is:

1. An electronic device, comprising:
    a base layer including an active area and a peripheral area adjacent to the active area;
    a circuit layer disposed on the base layer,
    a display element layer disposed on the circuit layer, the display element layer corresponding to the active area;
    a sensor layer disposed on the display element layer;
    a filter layer disposed on the sensor layer, the filter layer corresponding to the active area, the filter layer comprising a light blocking part and a color filter part disposed on the light blocking part, and the color filter part comprising a green filter part, a blue filter part, and a red filter part; and
    a protection layer disposed on the circuit layer, the protection layer corresponding to the peripheral area, the protection layer comprising:
    a color protection part, that comprises either a multi-color protection part or a light blocking protection part, wherein the multi-color protection part comprises a green protection part, a blue protection part, and a red protection part, and the light blocking protection part comprises a black pigment or a black dye,
    wherein the filter layer shares a common top surface plane and a common bottom surface plane with the protection layer, with the protection layer directly contacting the filter layer on at least two opposite sides thereof.

2. The electronic device of claim 1, wherein the peripheral area comprises:
    a first peripheral portion that is adjacent to the active area, does not overlap the display element layer, and overlaps the sensor layer; and
    a second peripheral portion which is spaced apart from the active area, does not overlap the display element layer, and does not overlap the sensor layer,
    wherein the protection layer overlaps the first peripheral portion and overlaps at least a portion of the second peripheral portion.

3. The electronic device of claim 2, wherein the second peripheral portion comprises:
    a bent portion bent with respect to a bending axis extending in one direction;
    a first sub peripheral portion disposed between the first peripheral portion and the bent portion; and
    a second sub peripheral portion spaced apart from the first peripheral portion and adjacent to an edge of the base layer.

4. The electronic device of claim 3, wherein the protection layer entirely overlaps the first peripheral portion and entirely overlaps the second peripheral portion.

5. The electronic device of claim 3, wherein the protection layer overlaps the first peripheral portion and the bent portion, does not overlap the first sub peripheral portion, and does not overlap the second sub peripheral portion.

6. The electronic device of claim 3, wherein the protection layer is the color protection part comprising the multi-color protection part, and wherein the protection layer overlaps the first peripheral portion and the protection layer comprises the green protection part, the blue protection part, and the red protection part, that are sequentially laminated.

7. The electronic device of claim 3, wherein the protection layer comprises a light blocking protection part overlapping the first peripheral portion.

8. The electronic device of claim 3, wherein the protection layer overlaps the second peripheral portion and the protection layer comprises the green protection part, the blue protection part, and the red protection part, that are sequentially laminated.

9. The electronic device of claim 3, wherein the protection layer is the color protection part comprising the multi-color protection part, and wherein the protection layer overlaps the bent portion, does not overlap the first sub peripheral portion, and does not overlap the second sub peripheral portion, and
    wherein the protection layer comprises the green protection part, the blue protection part, and the red protection part, that are sequentially laminated.

10. The electronic device of claim 3, wherein the protection layer overlaps the bent portion and does not overlap the first sub peripheral portion, and does not overlap the second sub peripheral portion, and
    wherein the protection layer comprises:
        a plurality of sub green protection parts spaced apart from each other on a plane;
        a plurality of sub blue protection parts spaced apart from each other on the plane; and
        a plurality of sub red protection parts spaced apart from each other on the plane,
    wherein each of the sub green protection parts of the plurality of sub green protection parts at least partially overlaps sub blue protection parts of the plurality of sub blue protection parts or sub red protection parts of the plurality of sub red protection parts, wherein each of the sub blue protection parts of the plurality of sub blue protection parts at least partially overlaps sub green protection parts of the plurality of sub green protection parts or sub red protection parts of the plurality of sub red protection parts, and wherein each of the sub red protection parts of the plurality of sub red protection parts at least partially overlaps sub green protection parts of the plurality of sub green protection parts or sub blue protection parts of the plurality of sub blue protection parts.

11. The electronic device of claim 3, further comprising a support layer disposed below the base layer, wherein the support layer does not overlap the bent portion.

12. The electronic device of claim 1, wherein the protection layer is the color protection part comprising the multicolor protection part, and wherein the green filter part and the green protection part are made of the same material, the blue filter part and the blue protection part are each made of a first material, and the red filter part and the red protection part are each made of a second material.

13. The electronic device of claim 1, wherein the protection layer is the light blocking protection part, and wherein the light blocking part and the light blocking protection part are made of a same material.

14. The electronic device of claim 1, wherein the sensor layer comprises:

a first conductive layer disposed on the display element layer;

a second conductive layer disposed on the first conductive layer; and an inorganic insulating layer disposed between the first conductive layer and the second conductive layer, wherein the light blocking part at least partially covers the second conductive layer.

15. The electronic device of claim 14, wherein the green filter part, the blue filter part, and the red filter part are disposed adjacent to each other on a plane, and wherein the light blocking part overlaps a boundary between the green filter part and the blue filter part, a boundary between the green filter part and the red filter part, or a boundary between the blue filter part and the red filter part.

16. The electronic device of claim 1, further comprising a window disposed on the sensor layer, the window including a transmission part and a bezel part, and wherein the protection layer corresponds to the bezel part.

17. An electronic device, comprising an active area and a peripheral area outside of the active area, the active area comprising a plurality of emission areas, the electronic device comprising:

a circuit layer;

a display element layer disposed on the circuit layer and including a light emitting element and a pixel defining layer separating each of the plurality of emission areas from each other;

a sensor layer disposed on the display element layer;

a filter layer disposed on the sensor layer corresponding to the active area, the filter layer comprising a light blocking part and a plurality of color filter parts disposed on the light blocking part; and a protection layer disposed on the circuit layer corresponding to the peripheral area, the protection layer comprising at least one of a light blocking protection part or a color protection part, the color protection part comprising a green protection part, a blue protection part, and a red protection part, wherein the filter layer shares a common top surface plane and a common bottom surface plane with the protection layer with the protection layer directly contacting the filter layer on at least two opposite sides thereof.

18. The electronic device of claim 17, wherein the peripheral area comprises:

a first peripheral portion wherein the first peripheral portion is adjacent to the active area, does not overlap the display element layer, and overlaps the sensor layer; and a second peripheral portion wherein the second peripheral portion is spaced apart from the active area, does not overlap the display element layer, and does not overlap the sensor layer, wherein the protection layer overlaps the first peripheral portion and at least a portion of the second peripheral portion.

19. The electronic device of claim 18, wherein the protection layer overlapping the first peripheral portion is disposed directly on the sensor layer.

20. The electronic device of claim 18, wherein the protection layer overlapping the first peripheral portion is disposed on the pixel defining layer.

* * * * *